United States Patent
Akaike et al.

(10) Patent No.: US 9,853,023 B2
(45) Date of Patent: Dec. 26, 2017

(54) SEMICONDUCTOR DEVICE AND SEMICONDUCTOR PACKAGE

(71) Applicant: KABUSHIKI KAISHA TOSHIBA, Tokyo (JP)

(72) Inventors: Yasuhiko Akaike, Kanazawa Ishikawa (JP); Kenya Kobayashi, Nonoichi Ishikawa (JP); Yukie Nishikawa, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/397,146

(22) Filed: Jan. 3, 2017

(65) Prior Publication Data

US 2017/0117269 A1 Apr. 27, 2017

Related U.S. Application Data

(62) Division of application No. 14/840,795, filed on Aug. 31, 2015, now Pat. No. 9,570,439.

(30) Foreign Application Priority Data

Mar. 13, 2015 (JP) .................................. 2015-050752

(51) Int. Cl.
*H01L 29/66* (2006.01)
*H01L 27/06* (2006.01)
(Continued)

(52) U.S. Cl.
CPC ...... *H01L 27/0635* (2013.01); *H01L 23/3128* (2013.01); *H01L 23/481* (2013.01);
(Continued)

(58) Field of Classification Search
CPC ............. H01L 27/0635; H01L 27/0814; H01L 27/088; H01L 27/0688; H01L 27/0629;
(Continued)

(56) References Cited

U.S. PATENT DOCUMENTS 4,980,743 A * 12/1990 Nakagawa .......... H01L 29/0696
257/143
7,271,477 B2 9/2007 Saito et al.
(Continued)

FOREIGN PATENT DOCUMENTS

| EP | 0795911 A2 | 9/1997 |
| JP | 2005197340 A | 7/2005 |
| JP | 2009-071059 A | 4/2009 |

OTHER PUBLICATIONS

Taiwan Office Action dated May 11, 2016, filed in Taiwan counterpart Application No. 104129062, 6 pages (with translation).

*Primary Examiner* — Victor A Mandala
(74) *Attorney, Agent, or Firm* — Patterson & Sheridan, LLP

(57) ABSTRACT

A semiconductor package in an embodiment includes a semiconductor device which has a first semiconductor element, a second semiconductor element, and a common first electrode between the first and second semiconductor elements. A second electrode is electrically connected to the first semiconductor element. A third electrode extends through the second semiconductor element and electrically connects to the first electrode. A fourth electrode is electrically connected to the second semiconductor element. A first terminal of the package is electrically connected to the third electrode. A second terminal of the package is electrically connected to the second electrode and the fourth electrode. An insulating material surrounds the semiconductor device.

12 Claims, 20 Drawing Sheets

(51) Int. Cl.
| | |
|---|---|
| *H01L 29/861* | (2006.01) |
| *H01L 29/739* | (2006.01) |
| *H01L 25/07* | (2006.01) |
| *H01L 23/00* | (2006.01) |
| *H01L 23/48* | (2006.01) |
| *H01L 23/495* | (2006.01) |
| *H01L 23/482* | (2006.01) |
| *H01L 27/08* | (2006.01) |
| *H01L 27/088* | (2006.01) |
| *H01L 23/31* | (2006.01) |
| *H01L 27/082* | (2006.01) |

(52) U.S. Cl.
CPC ...... *H01L 23/4824* (2013.01); *H01L 23/4952* (2013.01); *H01L 23/49562* (2013.01); *H01L 24/03* (2013.01); *H01L 24/05* (2013.01); *H01L 24/49* (2013.01); *H01L 25/072* (2013.01); *H01L 27/0629* (2013.01); *H01L 27/0688* (2013.01); *H01L 27/088* (2013.01); *H01L 27/0814* (2013.01); *H01L 29/7393* (2013.01); *H01L 29/7397* (2013.01); *H01L 29/861* (2013.01); *H01L 23/3121* (2013.01); *H01L 24/48* (2013.01); *H01L 27/0823* (2013.01); *H01L 29/8611* (2013.01); *H01L 2224/04026* (2013.01); *H01L 2224/04042* (2013.01); *H01L 2224/0603* (2013.01); *H01L 2224/45124* (2013.01); *H01L 2224/48247* (2013.01); *H01L 2224/48257* (2013.01); *H01L 2224/94* (2013.01); *H01L 2924/00014* (2013.01); *H01L 2924/13055* (2013.01); *H01L 2924/3511* (2013.01)

(58) Field of Classification Search
CPC ............. H01L 29/7397; H01L 23/3128; H01L 23/4824; H01L 23/481; H01L 23/4952; H01L 23/49562; H01L 24/05; H01L 24/03; H01L 24/49; H01L 25/072; H01L 29/861; H01L 29/7393; H01L 29/8611; H01L 27/0823; H01L 2924/00014; H01L 2224/48257; H01L 2224/0603; H01L 2924/3511; H01L 23/3121; H01L 23/292
See application file for complete search history.

(56) References Cited

U.S. PATENT DOCUMENTS

| | | |
|---|---|---|
| 8,748,975 B2 | 6/2014 | Fujiwara et al. |
| 2001/0012671 A1* | 8/2001 | Hoshino ......... H01L 21/823475 438/305 |
| 2007/0114522 A1* | 5/2007 | Kwok ................. G09G 3/3216 257/40 |
| 2009/0072369 A1 | 3/2009 | Oikawa |
| 2014/0034997 A1* | 2/2014 | Rahimo ............. H01L 29/0834 257/139 |
| 2015/0221757 A1* | 8/2015 | Nakayama ......... H01L 27/0605 257/20 |
| 2016/0118490 A1* | 4/2016 | Padmanabhan ..... H01L 27/0629 257/195 |

* cited by examiner

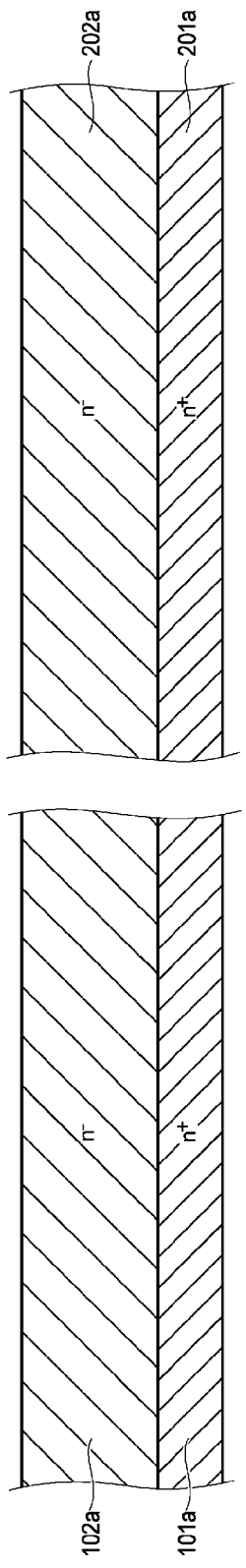

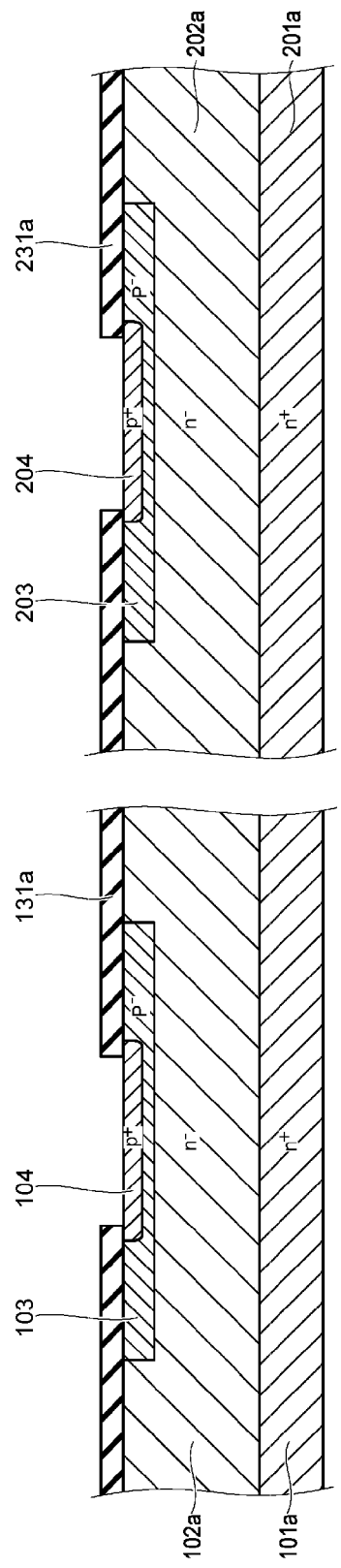
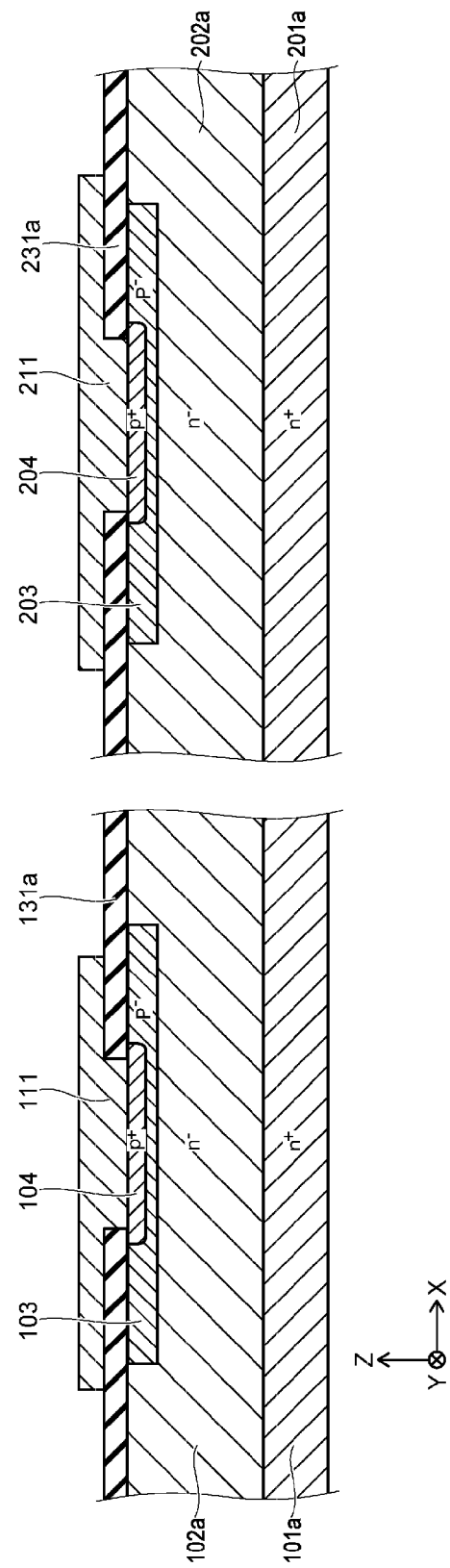
FIG. 5A
FIG. 5B

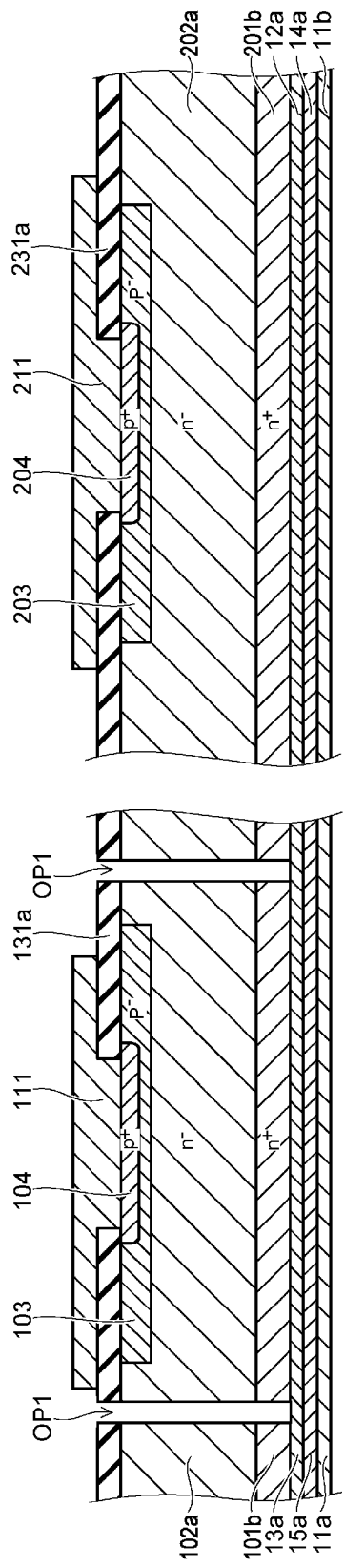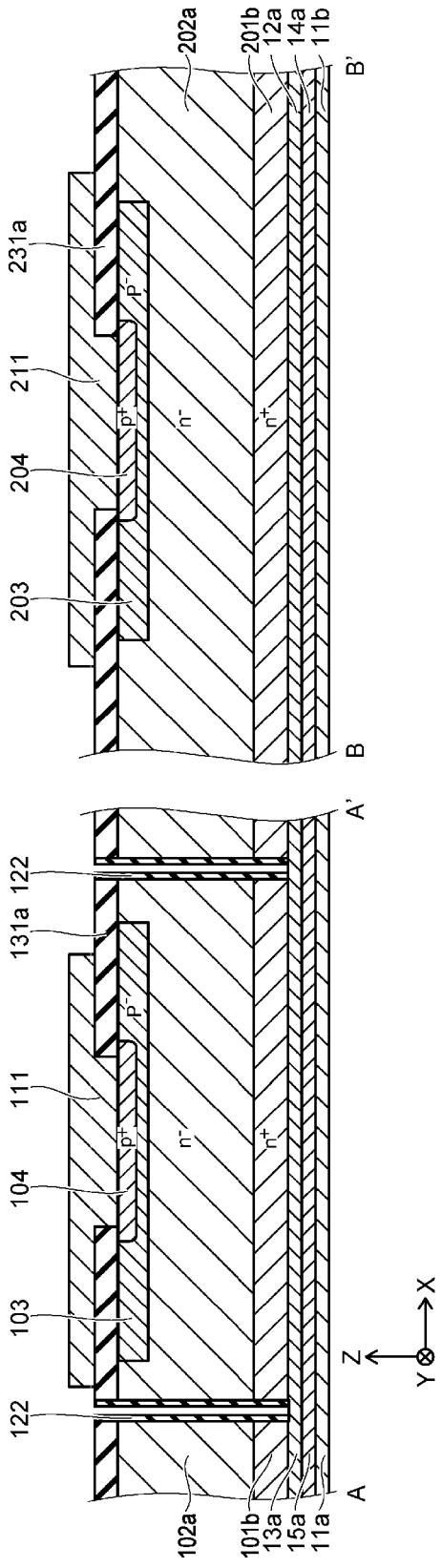

SEMICONDUCTOR DEVICE AND SEMICONDUCTOR PACKAGE

CROSS-REFERENCE TO RELATED APPLICATIONS

This application is a division of U.S. patent application Ser. No. 14/840,795, filed on Aug. 31, 2015, which claims the benefit of priority from Japanese Patent Application No. 2015-050752, filed on Mar. 13, 2015, the entire contents of which are incorporated herein by reference.

FIELD

Embodiments described herein relate generally to a semiconductor device and a semiconductor package.

BACKGROUND

A semiconductor device including semiconductor elements such as a diode, a metal oxide semiconductor field effect transistor (MOSFET), and an insulated gate bipolar transistor (IGBT) is widely used in various applications including power control. The size of a semiconductor device is desirably small.

DESCRIPTION OF THE DRAWINGS

FIGS. 4A and 4B are process sectional views illustrating a process of manufacturing the semiconductor device according to the first exemplary embodiment.

FIGS. 5A and 5B are process sectional views illustrating a process of manufacturing the semiconductor device according to the first exemplary embodiment.

FIGS. 7A and 7B are process sectional views illustrating a process of manufacturing the semiconductor device according to the first exemplary embodiment.

DETAILED DESCRIPTION

Figure 1:
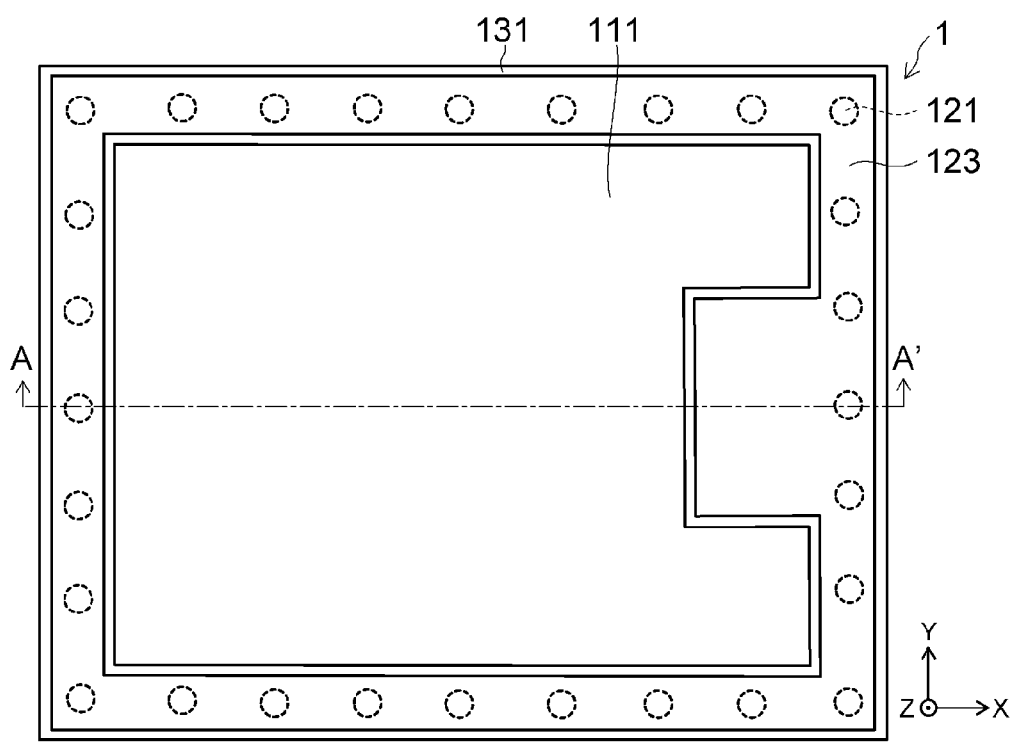
FIG. 1 is a plan view illustrating a semiconductor device according to a first exemplary embodiment.

Embodiments provide a semiconductor device and a semiconductor package which may be reduced in size.

In general, according to one embodiment, a semiconductor device includes a first semiconductor region of a first conductive type, a second semiconductor region of a second conductive type, a first electrode, a third semiconductor region of the second conductive type, a fourth semiconductor region of the first conductive type, and a conductive portion. The second semiconductor region is provided on the first semiconductor region. The first electrode is provided on the second semiconductor region. The third semiconductor region is provided on the first electrode. The fourth semiconductor region is provided on the third semiconductor region. The conductive portion is surrounded by the third semiconductor region and an intervening insulation portion and is electrically connected to the first electrode.

Hereinafter, respective exemplary embodiments will be described with reference to the accompanying drawings.

In addition, the accompanying drawings are schematic or conceptual and the relationship between the thickness and the width of each portion and the ratio of the size between portions may be different from the actual one. Further, even when the same portion is illustrated, drawings may illustrate the portions whose dimensions and ratios are different from one another.

Further, in the present specification and respective drawings, the same elements described above are denoted by the same reference numerals and the description thereof is not repeated.

In the description of respective exemplary embodiment, an XYZ orthogonal coordinate system is used. Two directions which are parallel to main surfaces of a semiconductor layer S1 and a semiconductor layer S2 and orthogonally intersect each other are set as an X direction and a Y direction and a direction perpendicular to both X direction and Y direction is set as a Z direction.

In the description below, expressions of $n^+$, n, and $n^-$, $p^+$, p, and $p^-$ indicate a relative level of impurity concentration in each conductive type. That is, n type impurity concentration of $n^+$ is relatively higher than that of n and the n type impurity concentration of $n^-$ is relatively lower than that of n. Further, p type impurity concentration of $p^+$ is relatively higher than that of p and p type impurity concentration of $p^-$ is relatively lower than that of p.

In respective exemplary embodiments described below, the respective exemplary embodiments may be carried out by reversing the p type and the n type of respective semiconductor regions.

First Exemplary Embodiment

FIG. 1 is a plan view illustrating a semiconductor device 1 according to a first exemplary embodiment. Conductive portions 121 are illustrated by dashed lines in FIG. 1.

Figure 2:
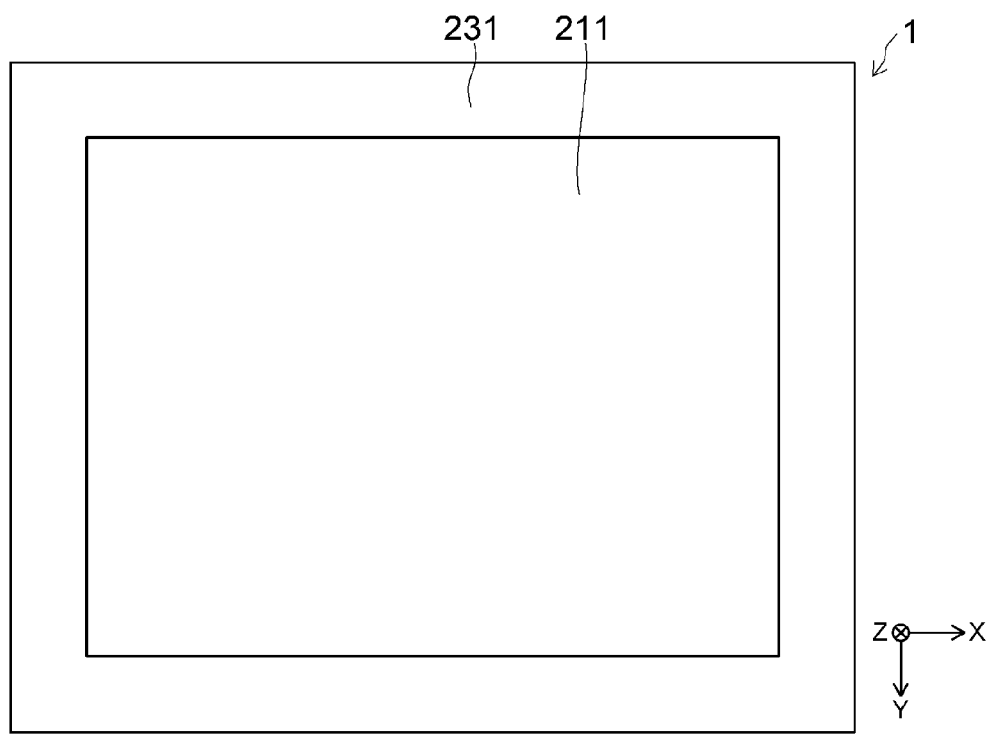
FIG. 2 is a bottom view of the semiconductor device according to the first exemplary embodiment.

FIG. 2 is a bottom view of the semiconductor device 1 according to the first exemplary embodiment.

Figure 3:
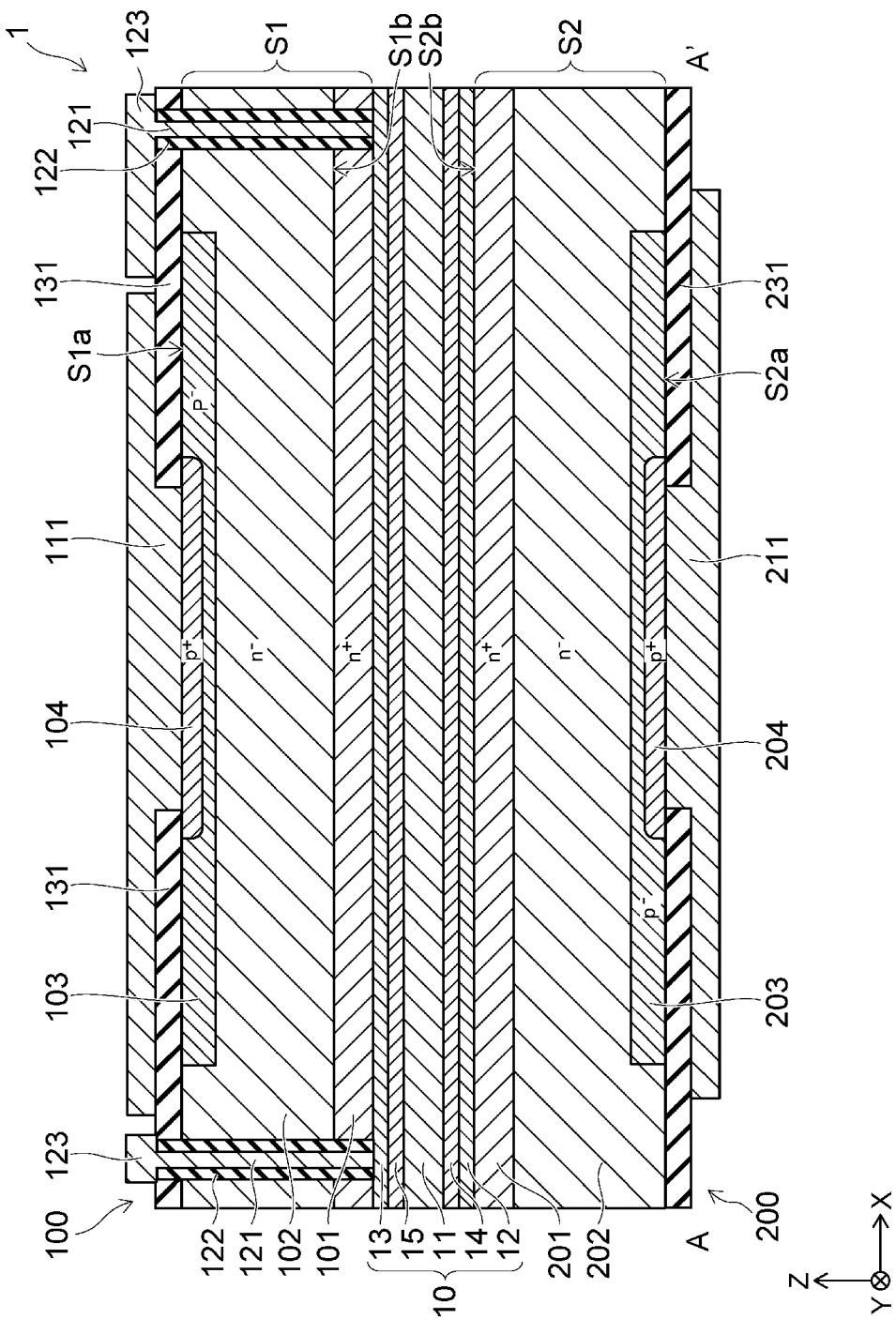
FIG. 3 is a sectional view taken along line A-A' of FIG. 1.

FIG. 3 is a sectional view taken along line A-A' of FIG. 1.

As illustrated in FIG. 3, the semiconductor device 1 includes a semiconductor element unit 100, a semiconductor element unit 200, and a first electrode 10 provided between the semiconductor element unit 100 and the semiconductor element unit 200.

The semiconductor element unit 100 is, for example, a diode. The semiconductor element unit 100 includes an $n^+$ type semiconductor region 101, an $n^-$ type (second conductive type) semiconductor region 102 (third semiconductor region), a $p^-$ type (first conductive type) semiconductor region 103 (fourth semiconductor region), a $p^+$ type semiconductor region 104, an anode electrode 111 (fourth electrode), a plurality of conductive portions 121, a plurality of insulation portions 122, a second electrode 123, and an insulation layer 131.

The semiconductor element unit 200 is, for example, a diode. The semiconductor element unit 200 includes an $n^+$ type semiconductor region 201, an $n^-$ type semiconductor region 202 (second semiconductor region), a $p^-$ type semiconductor region 203 (first semiconductor region), a $p^+$ type semiconductor region 204, an anode electrode 211 (third electrode), and an insulation layer 231.

As illustrated in FIG. 1, the anode electrode 111 and the second electrode 123 are provided on the upper surface of the semiconductor device 1 and spaced from each other by an intervening gap or open space. The anode electrode 111 is surrounded by, for example, the second electrode 123. The anode electrode 111 may be provided as a plurality of individual electrodes. In the same manner, the second electrode 123 may be provided as a plurality of individual electrodes.

As illustrated in FIG. 2, the anode electrode 211 is provided on the lower surface of the semiconductor device 1. The cross sectional or surface area of the anode electrode 211 is larger than the cross sectional or surface area of the anode electrode 111. In addition, the cross sectional or surface area of the anode electrode 211 may be smaller than or equal to the area of the anode electrode 111. The anode electrode 211 may be provided as a plurality of electrodes.

As illustrated in FIG. 1, the semiconductor device 1 includes a plurality of conductive portions 121. Alternatively, the semiconductor device 1 may include only one conductive portion 121. The second electrode 123 overlaps the plurality of conductive portions 121 when viewed from a Z direction, and is in and electrically contact therewith. The plurality of conductive portions 121 are provided about the periphery of the anode electrode 111 when viewed from the Z direction, and extend through the semiconductor element 100.

As illustrated in FIG. 3, an anode electrode 111 is provided on the front surface S1a of the semiconductor layer S1 and the first electrode 10 is provided on the rear surface S1b of the semiconductor layer S1. A second anode electrode 211 is provided on the front surface S2a of the semiconductor layer S2 and the first electrode 10 is provided on the rear surface S2b of the semiconductor layer S2. That is, the first electrode 10 is provided between the rear surface S1b of the semiconductor layer S1 and the rear surface S2b of the semiconductor layer S2, such that the first electrode 10 is common to both first and second semiconductor elements 100, 200.

In the second semiconductor element 200, the second anode electrode 211 is electrically connected to a $p^+$ type semiconductor region 204. A $p^-$ type semiconductor region 203 extends over, and to either side of, the $p^+$ type semiconductor region 204 on the side thereof opposite to the second anode electrode 211. The $p^-$ type semiconductor region 203 thus covers, the $p^+$ type semiconductor region 204 in the Z direction, and also and surrounds the $p^+$ type semiconductor region 204 in the X and Y directions. In other words, the $p^+$ type semiconductor region 204 is selectively provided between the $p^-$ type semiconductor region 203 and the second anode electrode 211.

An $n^-$ type semiconductor region 202 is provided over, and surrounds, the $p^-$ type semiconductor region 203. The $n^-$ type semiconductor region 202 extends over the $p^-$ type semiconductor region 203 in the Z direction and surrounds the $p^-$ type semiconductor region 203 in the X and Y directions. A portion of the $p^-$ type semiconductor region 203 is provided between the $n^-$ type semiconductor region 202 and the $p^+$ type semiconductor region 204. The $p^-$ type semiconductor region 203 is provided on the entire surface of the $p^+$ type semiconductor region 204 facing the $n^-$ type semiconductor region 202.

An $n^+$ type semiconductor region 201 is provided on the $n^-$ type semiconductor region 202 on the side thereof opposite to the location of the $p^-$ type semiconductor region 203. A first electrode 10 is provided on the $n^+$ type semiconductor region 201. The $n^+$ type semiconductor region 201 is electrically connected to the first electrode 10.

Configuring the first semiconductor element 100, an $n^+$ type semiconductor region 101 is provided on the first electrode 10 on the side thereof opposite to the $n^+$ type semiconductor region 201. The $n^+$ type semiconductor region 101 is electrically connected to the first electrode 10. An semiconductor region 102 is provided on the $n^+$ type semiconductor region 101 on the side thereof opposite to the first electrode 10.

A $p^-$ type semiconductor region 103 is selectively provided on, and extends inwardly of, the $n^-$ type semiconductor region 102 on the side thereof opposite to the $n^+$ type semiconductor region 101. The $p^-$ type semiconductor region 103 is surrounded by, for example, a portion of the $n^-$ type semiconductor region 102 in the X and Y directions. Alternatively, the $p^-$ type semiconductor region 103 may be provided on the entire surface of the $n^-$ type semiconductor region 102.

A $p^+$ type semiconductor region 104 is selectively provided on, and extends inwardly of, the $p^-$ type semiconductor region 103 on the side thereof opposite to the $n^-$ type semiconductor region 102. The $p^+$ type semiconductor region 104 is thus surrounded by a portion of the n type semiconductor region 103 in the X and Y directions. The $p^+$ type semiconductor region 104 is electrically connected to the anode electrode 111.

Each of the individual conductive portions 121 are surrounded by an insulation portion 122. The conductive portion 121 and the insulation portion 122 extend through the $n^+$ type semiconductor region 101, the $n^-$ type semiconductor region 102, and the insulation layer 131 in the Z direction. In other words, the conductive portions 121 are surrounded by the $n^+$ type semiconductor region 101 and the $n^-$ type semiconductor region 102 and electrically isolated therefrom by the insulation portions 122 surrounding each of them. The conductive portion 121 may also extend through the $p^-$ type semiconductor region 103 and the $p^+$ type semiconductor region 104 in the Z direction.

The conductive portions 121 are electrically connected to the first electrode 10. The conductive portion 121 may alternatively be electrically connected to the first electrode 10 through the $n^+$ type semiconductor region 101. In this case, in order to reduce electrical resistance between the first electrode 10 and the conductive portion 121, it is preferable that the first electrode 10 and the conductive portions 121 are connected to each other without interposing a semiconductor region therebetween.

The second electrode 123 is provided on the conductive portion 121. The second electrode 123 is electrically connected to the conductive portions 121. The conductive portions 121 and the second electrode 123 may be integrally provided. That is, the conductive portion 121 and the second electrode 123 have no boundary therebetween, and may be a seamless electrically conductive structure. The second electrode 123 is spaced from the anode electrode 111 in the X direction and the Y direction by a gap or space therebetween.

An insulation layer 231 is provided between a portion of the anode electrode 211 and a portion of the $p^+$ type semiconductor region 204 and between a portion of the anode electrode 211 and a portion of the $p^-$ type semiconductor region 203 surrounding the $p^+$ type semiconductor region 204. In the same manner, an insulation layer 131 is provided between a portion of the anode electrode 111 and a portion of the $p^+$ type semiconductor region 104 and between a portion of the anode electrode 111 and a portion of the $p^-$ type semiconductor region 103 surrounding the $p^+$ type semiconductor region 104.

The first electrode 10 includes, for example, a first layer 11, a second layer 12, a third layer 13, a fourth layer 14, and a fifth layer 15 as illustrated in FIG. 3. The second layer 12, the fourth layer 14, the first layer 11, the fifth layer 15, and the third layer 13 are overlay the $n^+$ type semiconductor region 201 in this order. The $n^+$ type semiconductor region 101 is provided on the third layer 13.

The first layer 11 includes, for example, at least one of gold, tin, and indium. Two metal layers may be bonded to the first layer 11. That is, the first layer 11 may be formed by bonding together two layers containing at least any one of gold, tin, and indium without interposing other layers therebetween.

The fourth layer 14 and the fifth layer 15 contain, for example, at least one of titanium, platinum, tungsten, tantalum, and vanadium. The material contained in the fourth layer 14 may be different from the material contained in the fifth layer 15. The fourth layer 14 is provided in order to improve adhesion between the first layer 11 and the second layer 12, for example. In the same manner, the fifth layer 15 is provided in order to improve adhesion between the first layer 11 and the third layer 13.

The second layer 12 is, for example, a layer which functions as a barrier to suppress reaction between the first layer 11 and the $n^+$ type semiconductor region 201. In the same manner, the third layer 13 functions as a barrier, and may be provided in order to suppress reaction between the first layer 11 and the $n^+$ type semiconductor region 101.

The second layer 12 and the third layer 13 contain, for example, titanium nitride. Alternatively, the second layer 12 and the third layer 13 contain titanium tungsten. The material contained in the second layer 12 may be different from the material contained in the third layer 13.

A method of manufacturing the semiconductor device 1 according to the first exemplary embodiment is now described with reference to FIGS. 4A to 9.

Figure 8:
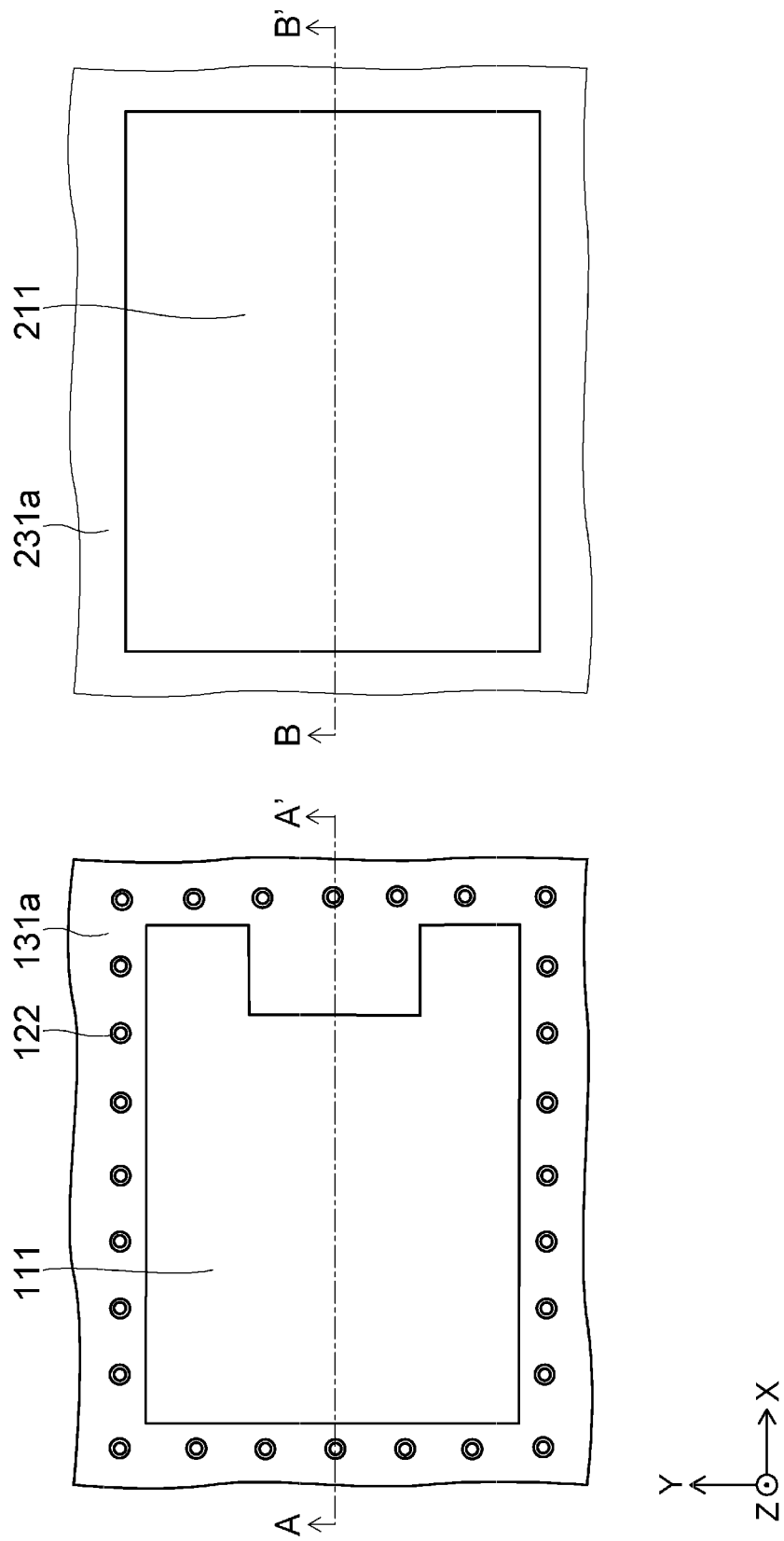
FIG. 8 is a process sectional view illustrating a process of manufacturing the semiconductor device according to the first exemplary embodiment.

FIGS. 4A to 7B and 9 are sectional views illustrating the intermediate forms of the semiconductor device 1 during the process of manufacturing the semiconductor device 1 according to the first exemplary embodiment. FIG. 8 is a plan view illustrating an intermediate form of the semiconductor device 1 during the process of manufacturing the semiconductor device 1 according to the first exemplary embodiment. FIGS. 4A to 7A and 9 are sectional views in a position corresponding to the line A-A' of FIG. 8.

In FIGS. 4A to 7B and 9, the left side portions of the Figs. illustrate intermediate forms of the semiconductor device 1 during the a process of manufacturing the semiconductor element unit 100, and the right side portions of the Figs. illustrate intermediate forms of the semiconductor device 1 during the a process of manufacturing the semiconductor element unit 200.

First, an $n^+$ type semiconductor substrate 101a and an $n^+$ type semiconductor substrate 201a (hereinafter, respectively referred to as an $n^+$ type substrate 101a and an $n^+$ type substrate 201a) are prepared. The main component of the respective substrates is silicon (Si), gallium arsenide, silicon carbide, gallium nitride, and the like.

Subsequently, as illustrated in FIG. 4A, $n^-$ type semiconductor layers 102a and 202a are formed on the respective substrates by epitaxial growth of Si while doping an n type dopant therein. As the n type dopant, for example, phosphorus or arsenic may be used.

Then, the $p^-$ type semiconductor regions 103 and 203 are formed by ion-implanting a p type dopant into a portion of each $n^-$ type semiconductor layer adjacent the surface thereof, as illustrated in FIG. 4B. As the p type dopant, for example, boron may be used.

Subsequently, an insulation film layer is formed on each of the $n^-$ type semiconductor layer and the $p^-$ type semiconductor region. Then, the insulation layers 131a and 231a are formed by patterning the insulation film layers. At this point, a portion of the $p^-$ type semiconductor region 103 and a portion of the $p^-$ type semiconductor region 203 are exposed. Then, as illustrated in FIG. 5A, the $p^+$ type semiconductor regions 104 and 204 are formed by ion-implanting a p type dopant into the portions of the $p^-$ type semiconductor regions exposed by the opening in the insulation layers 231a, 231b.

Metal layers are then formed on the respective $p^+$ type semiconductor regions and the respective insulation layers. These metal layers are formed using a chemical vapor deposition (CVD) method or a physical vapor deposition (PVD) method. For example, aluminum, copper, nickel, titanium, or tungsten may be used as materials of the metal layers. The contact locations of the metal layers and the $p^+$ type semiconductor regions form an ohmic contact.

Then, as illustrated in FIG. 5B, the first and second anode electrodes 111 and 211 are formed by patterning these metal layers. The shape and the size of the anode electrode 111 may be different from the shape and the size of the anode electrode 211.

Figure 6A:
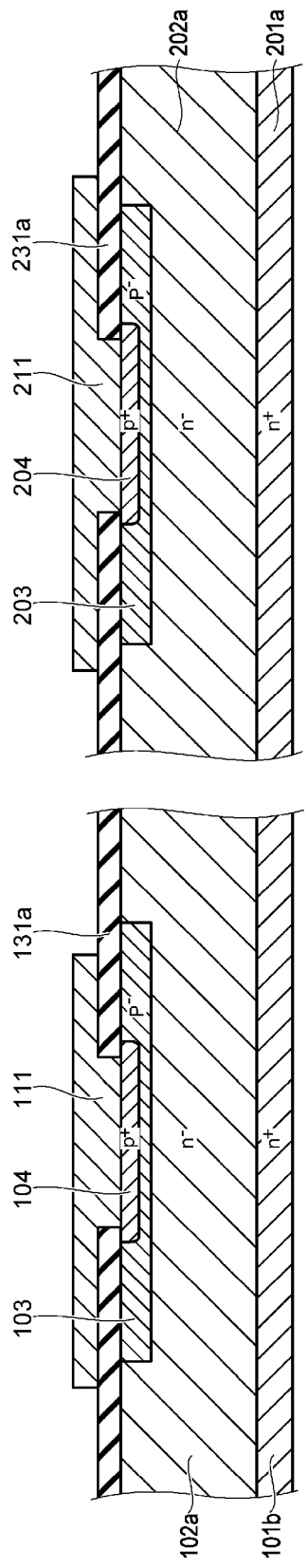
FIGS. 6A and 6B are process sectional views illustrating a process of manufacturing the semiconductor device according to the first exemplary embodiment.

After forming the first and second anode electrodes 111, 211, the rear surfaces of the $n^+$ type substrates 101a and 201a are polished away until the $n^+$ type substrates 101a and 201a have a predetermined thickness. By performing this process, $n^+$ type semiconductor regions 101b and 201b are formed as illustrated in FIG. 6A.

Figure 6B:
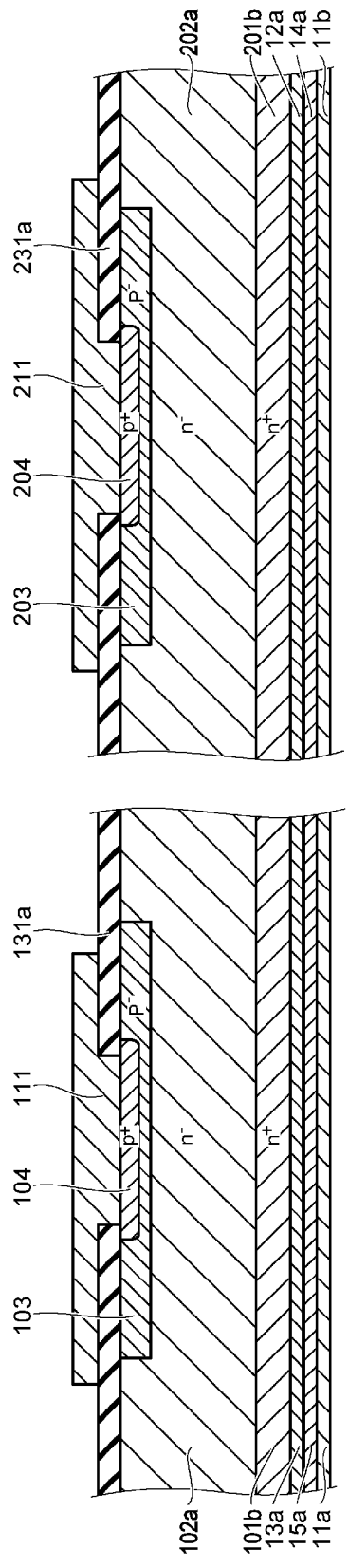

Then, as illustrated in FIG. 6B, for example, conductive layers 11a, 15a, and 13a are formed on the rear surface of the $n^+$ type semiconductor region 101b. Further, for example, conductive layers 11b, 14a, and 12a are formed on the rear surface of the $n^+$ type semiconductor region 201b.

Subsequently, a plurality of openings OP1 are formed, for example, on the periphery of the $p^-$ type semiconductor region 103 as illustrated in FIG. 7A. The openings OP1 extend through, for example, the $n^+$ type semiconductor region 101b and the $n^-$ type semiconductor region 102a at a location spaced from the perimeter of the first anode electrode 111. In addition, at this time, a portion of the upper surface of the conductive layer 15a may be exposed at the base of the opening OP1 by extending the openings OP1 through the conductive layer 13a.

Then, an insulation layer is formed on the inner walls of the openings OP1. As illustrated in FIG. 7B, an insulation portion 122 covering only the side wall of the opening OP1 is formed by removing any insulation material deposited on the bottom portion (upper surface of the conductive layer 15a) of the opening OP1. The appearance of the element units 100, 200 at this time is as illustrated in FIG. 8.

Figure 9:
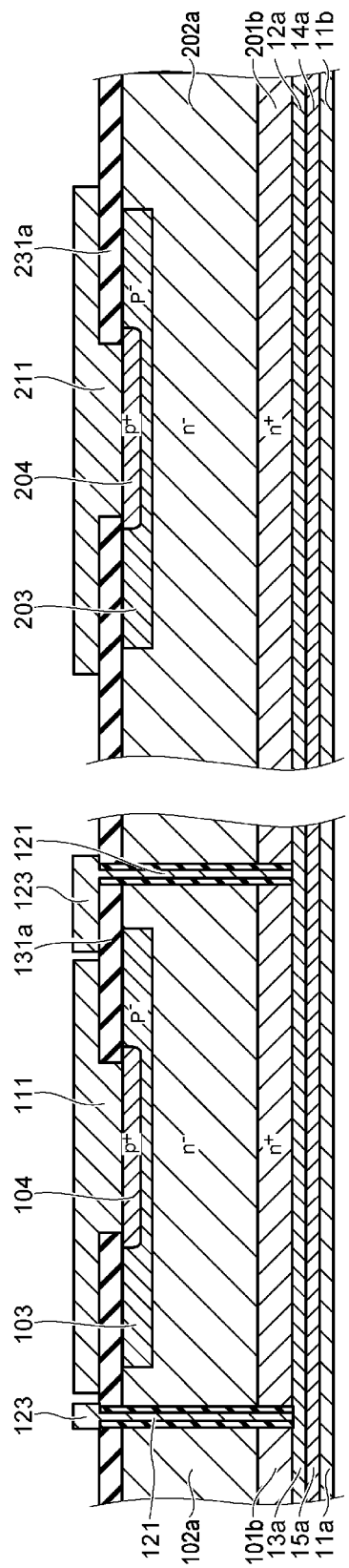
FIG. 9 is a process sectional view illustrating a process of manufacturing the semiconductor device according to the first exemplary embodiment.

Then, as illustrated in FIG. 9, conductive layers are formed within the insulation portion 122, on the insulation portion 122, and on a portion of the insulation layer 131a. The conductive layer contains, for example, copper and is formed using a plating method, while the first anode electrode 111 and portions of the insulating layer 131a are protected by a mask, which is removed after the plating is completed. The conductive portion 121 and the second electrode 123 illustrated in FIG. 3 are formed by performing this process.

Subsequently, the conductive layer 11a formed on the rear surface of the n⁺ type semiconductor region 101b and the conductive layer 11b formed on the rear surface of the n⁺ type semiconductor region 201b are bonded to each other via direct bonding. Then, the semiconductor device 1 illustrated in FIGS. 1 to 3 is obtained by dividing the obtained structure into a plurality of structures.

In addition, in the examples of the manufacturing method illustrated in FIGS. 4A to 9, although a case where the semiconductor element unit 100 and the semiconductor element unit 200 are formed on substrates which are different from each other is described, these semiconductor element units may be formed on the same substrate. In this case, the semiconductor device 1 is obtained by bonding a semiconductor chip including the semiconductor element unit 100 to a semiconductor chip including the semiconductor element unit 200 after the substrate on which the semiconductor element unit 100 and the semiconductor element unit 200 are formed is divided into a plurality of semiconductor chips.

The semiconductor device 1 according to the present exemplary embodiment includes the semiconductor element units 100 and 200 stacked on each other and connected by a shared first electrode 10. When such a configuration is employed, the semiconductor device may be made small and multiple devices 1 can be mounted adjacent to one another at high density. The area of the semiconductor device 1 may be widened according to the packaged device footprint area which is reduced by stacking the semiconductor element units 100 and 200 on each other, resulting lower current density in the device because the area is larger for the same current therethrough. As a result, the possibility of occurrence of destruction of the semiconductor device may be reduced by reducing the density of the current flowing in the semiconductor device.

Moreover, the semiconductor device 1 is surrounded by the n⁺ type semiconductor region 101 and the n⁻ type semiconductor region 102 and includes the conductive portion 121 which is electrically connected to the first electrode 10. When the semiconductor device 1 includes the conductive portion 121, an electrode pad electrically connected to the first electrode 10 may be provided on the upper surface of the semiconductor device 1. For this reason, for example, the semiconductor device 1 may be easily mounted compared to the case where the semiconductor element units 100 and 200 are separately positioned on a surface, such as copper plate or lead frame.

In addition, since the semiconductor device 1 is obtained by bonding two semiconductor element units 100, 200 to each other in a state in which the two semiconductor element units face each other, warpage of the semiconductor element units cancel each other, and thus warpage of the resulting semiconductor device 1 is reduced. Particularly, if the function of the semiconductor element unit 100 is the same as the function of the semiconductor element unit 200, a difference between the stress generated due to the structure of the semiconductor element unit 100, and the stress generated due to the structure of the semiconductor element unit 200 becomes reduced. Accordingly, if the semiconductor element units 100 and 200 have the same structure, the warpage of the semiconductor device 1 is further reduced.

When a plurality of the conductive portions 121 are provided, electrical resistance between the first electrode 10 and a terminal connected to the first electrode 10 may be reduced. Therefore, on-resistance of the semiconductor device 1 may be reduced.

Further, when the first electrode 10 includes the second layer 12 and the third layer 13 which contain titanium nitride or titanium tungsten, a reaction between the metal material contained in the first layer 11 and the semiconductor material contained in each semiconductor layer may be suppressed, improving the life and integrity of the semiconductor material layers.

In addition, when the first electrode 10 includes the fourth layer 14 and the fifth layer 15 which contain titanium, peeling of the second layer 12 from the first layer 11 and peeling of the third layer 13 from the first layer 11 may be suppressed and the yield of useful devices in the manufacture of the semiconductor device 1 may be improved.

Second Exemplary Embodiment

Figure 10:
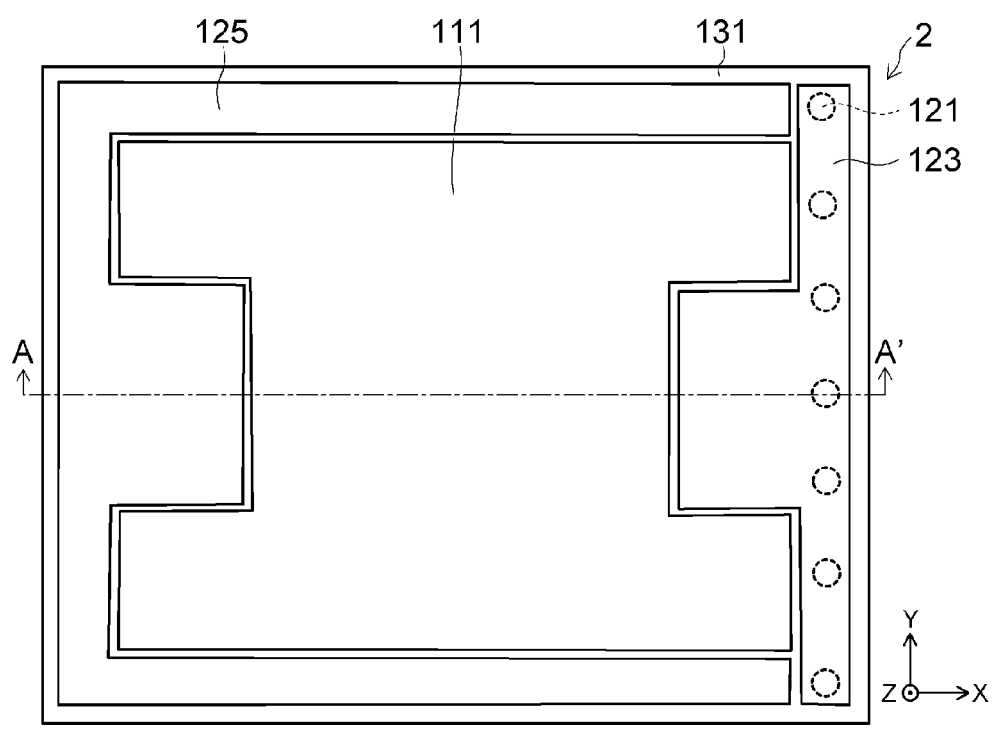
FIG. 10 is a plan view illustrating a semiconductor device according to a second exemplary embodiment.

FIG. 10 is a plan view illustrating a semiconductor device 2 according to a second exemplary embodiment. Individual conductive portions 121 are illustrated in dashed line outline in FIG. 10.

Figure 11:
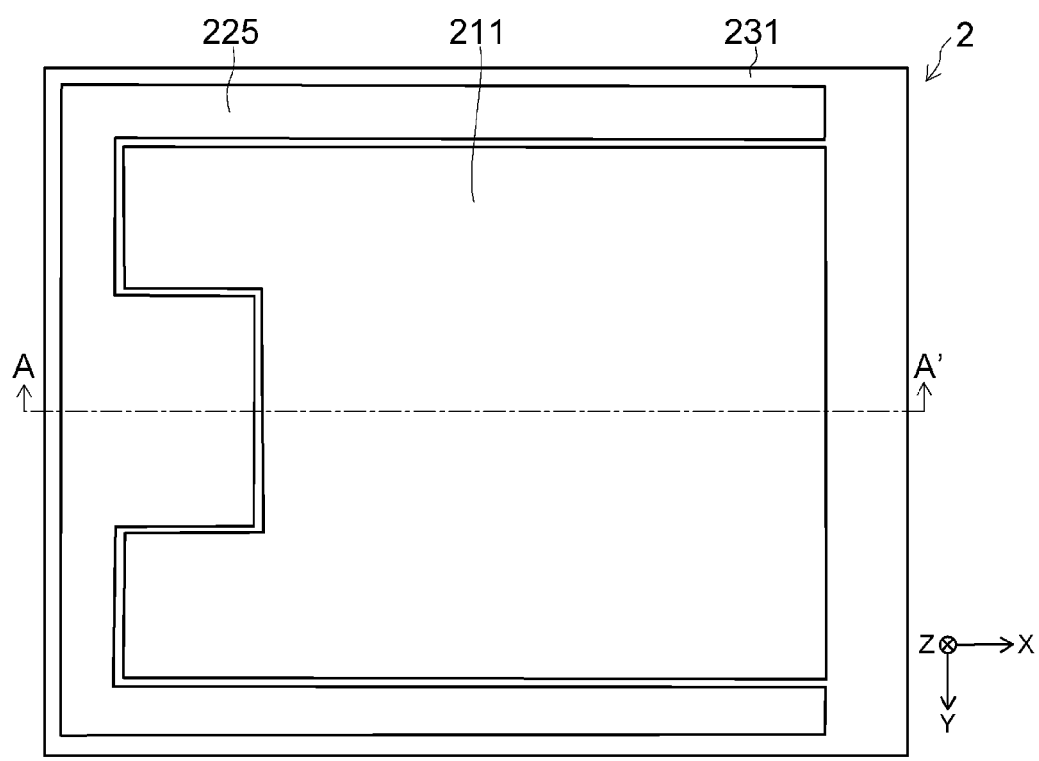
FIG. 11 is a bottom view of the semiconductor device according to the second exemplary embodiment.

FIG. 11 is a bottom view of the semiconductor device 2 according to the second exemplary embodiment.

Figure 12:
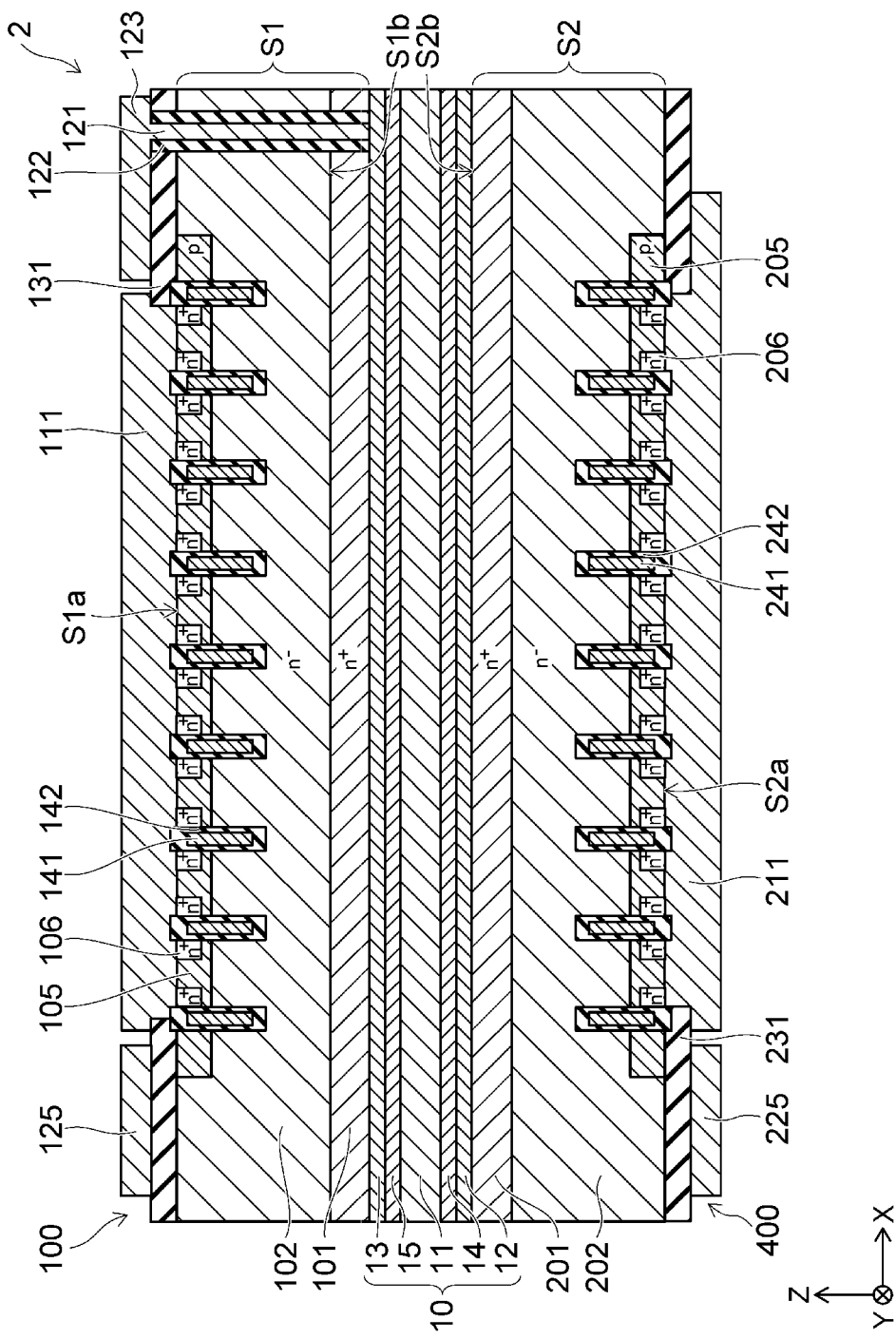
FIG. 12 is a sectional view taken along line A-A' of FIG. 10.

FIG. 12 is a sectional view taken along line A-A' of FIG. 10.

The semiconductor device 2 includes a semiconductor element unit 300, a semiconductor element unit 400, and a first electrode 10 extending therebetween.

The semiconductor element unit 300 is, for example, a MOSFET. The semiconductor element unit 300 includes an n⁺ type drain region 101, an n⁻ type semiconductor region 102 (third semiconductor region), a p type base region 105 (fourth semiconductor region), n⁺ type source regions 106 (fifth semiconductor region), a source electrode 111 (fourth electrode), conductive portions 121 extending through the n⁺ type drain region 101 and n⁻ type semiconductor regions 102, insulation portions 122 lining the sidewalls of the openings through which the conductive portions 121 extend, a second electrode 123, a gate electrode pad 125 (fifth electrode), an insulation layer 131, gate electrodes 141, and gate insulation layers 142.

The semiconductor element unit 400 is, for example, a MOSFET. The semiconductor element unit 400 includes an n⁺ type drain region 201, an n⁻ type semiconductor region 202 (second conductive type second semiconductor region), a p type base region 205 (first conductive type first semiconductor region), n⁺ type source regions 206, a source electrode 211 (third electrode), a gate electrode pad 225, an insulation layer 231, gate electrodes 241, and gate insulation layers 242.

As illustrated in FIG. 10, the source electrode 111, the second electrode 123, the gate electrode pad 125, and the insulation layer 131 are provided on the upper (outer) surface of the semiconductor device 2. The source electrode 111, the second electrode 123, and the gate electrode pad 125 are spaced from each another with gaps therebetween. The gate electrode pad 125 is electrically connected to the plurality of the gate electrodes 141.

At least a portion of the source electrode 111 is provided, for example, between the second electrode 123 and the gate electrode pad 125 in the X direction.

The source electrode 111 may be provided as a plurality of electrodes. In this case, for example, at least a portion of the second electrode 123 is provided among the source electrodes 111.

As illustrated in FIG. 11, the source electrode 211, the gate electrode pad 225, and the insulation layer 231 are provided on the lower (inner facing) surface of the semiconductor device 2. The source electrode 211 and the gate electrode pad 225 are spaced from each other with a gap therebetween. The gate electrode pad 225 is electrically connected to the plurality of gate electrodes 241. The source electrode 211 may be divided into a plurality of electrodes. In the same manner, the gate electrode pad 225 may be divided into a plurality of pads.

As illustrated in FIG. 12, the p type base region 205 is selectively provided between the n⁻ type semiconductor region 202 and the source electrode. For example, a plurality of the p type base regions 205 are provided and spaced apart in the X direction. The n⁺ type source regions 206 are selectively provided in the p type base region 205. The source electrode 211 is electrically connected to the n⁺ type source region 206.

The gate electrodes 241 face at least the p type base region 205 through the intervening gate insulation layers 242. In the example illustrated in FIG. 12, the gate insulation layer 242 is provided among the gate electrode 241, a portion of the n⁻ type semiconductor region 202, the p type base region 205, and at least a portion of the n⁺ type source region 206.

The first electrode 10 is electrically connected to the drain region 201 provided on the n⁻ type semiconductor region 202 and the n⁺ type drain region 101 provided below the n⁻ type semiconductor region 102. The first electrode 10 may function as the drain electrodes of the semiconductor element units 300 and 400.

The p type base region 105 is selectively provided on the n⁻ type semiconductor region 102. For example, a plurality of the p type base regions 105 are provided in the X direction. For example, the n⁺ type source region 106 is selectively provided on the p type base region 105. The source electrode 111 is electrically connected to the n⁺ type source region 106.

The gate electrode 141 faces at least the p type base region 105 with the gate insulation layer 142 disposed therebetween. The gate insulation layer 142 is provided, for example, among the gate electrode 141, a portion of the n⁻ type semiconductor region 102, the p type base region 105, and at least a portion of the n⁺ type source region 106.

The MOSFET enters an ON state when a voltage more than or equal to a threshold value is applied to the gate electrodes 141 and 241 in a state in which a positive voltage is applied to the first electrode 10 with respect to the source electrodes 111 and 211. At this time, a channel (inversion layer) is formed in a region in the vicinity of the gate insulation layer 142 of the p type base region 105 and in a region in the vicinity of the gate insulation layer 242 of the p type base region 205.

Even in the present exemplary embodiment, similar to the first exemplary embodiment, miniaturization of the semiconductor device or a decrease in the density of the current flowing in the semiconductor device may be achieved.

Moreover, a combination of the semiconductor element unit 300 described in the present exemplary embodiment and the semiconductor element unit 200 described in the first exemplary embodiment may be configured. Alternatively, a combination of the semiconductor element unit 400 described in the present exemplary embodiment and the semiconductor element unit 100 described in the first exemplary embodiment may be configured.

Third Exemplary Embodiment

Figure 13:
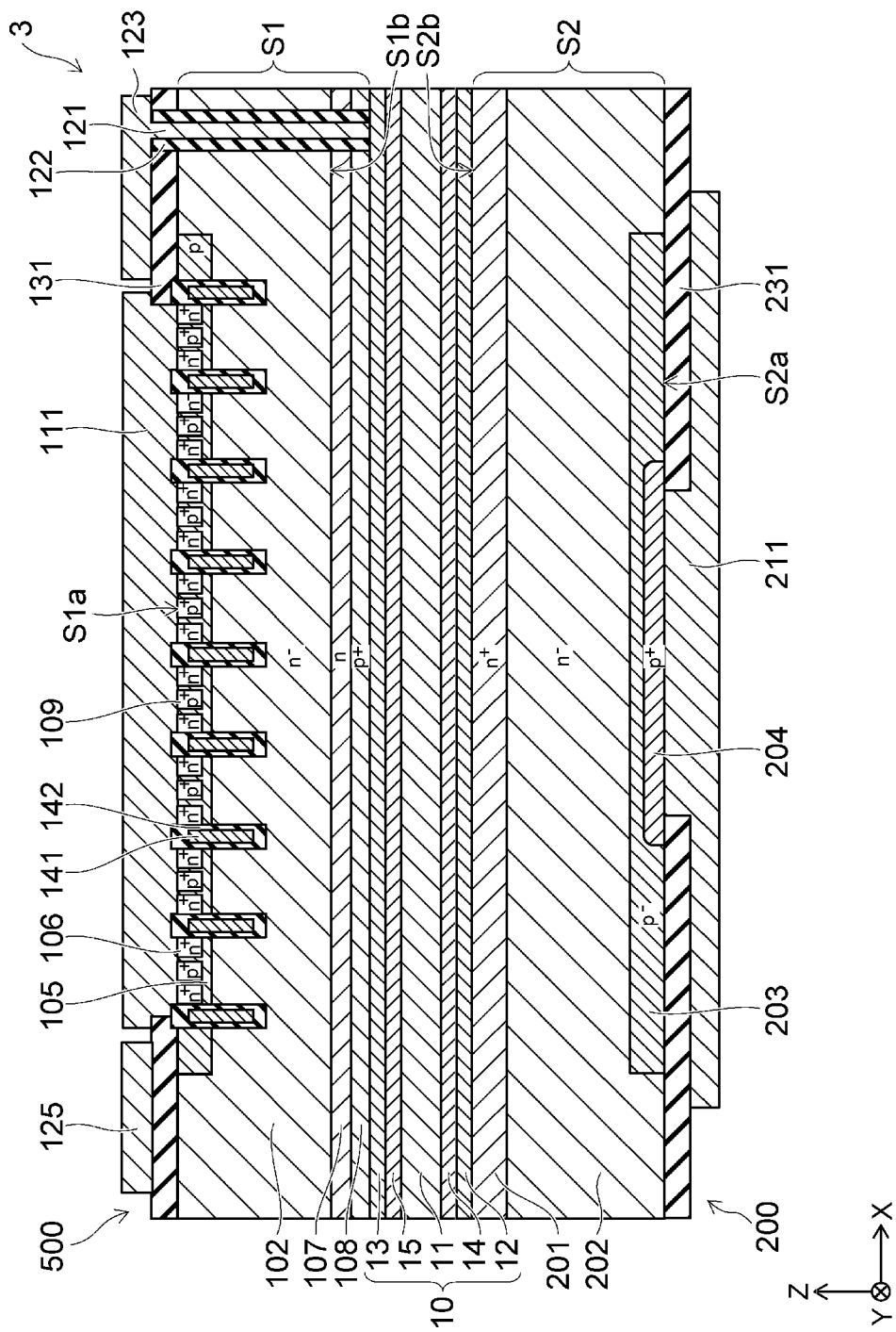
FIG. 13 is a sectional view illustrating a semiconductor device according to a third exemplary embodiment.

FIG. 13 is a sectional view illustrating a semiconductor device 3 according to a third exemplary embodiment.

The structure of the semiconductor device 3 when seen from the Z direction is the same as the structure in the plan view illustrated in FIG. 10. The structure of the semiconductor device 3 when seen from the −Z direction is the same as the structure in the bottom view illustrated in FIG. 2.

The semiconductor device 3 includes a semiconductor element unit 500, a semiconductor element unit 200, and a first electrode 10.

The semiconductor element unit 500 is, for example, an IGBT. The semiconductor element unit 500 includes a p⁺ type collector region 108 (sixth semiconductor region), an n type semiconductor region 107, an n⁻ type semiconductor region 102 (third semiconductor region), p type base regions 105 (fourth semiconductor region), n⁺ type source regions 106 (fifth semiconductor region), p⁺ type contact regions 109, an emitter electrode 111 (fourth electrode), conductive portion 121, insulation portions 122, a second electrode 123, a gate electrode pad 125 (fifth electrode), an insulation layer 131, a gate electrode 141, and a gate insulation layer 142.

The semiconductor element unit 200 is, for example, a diode.

The p⁺ type collector region 108 is provided on the first electrode 10. The p⁺ type collector region 108 is electrically connected to the first electrode 10. The first electrode 10 may function as a collector electrode of the semiconductor element unit 500 and as a cathode electrode of the semiconductor element unit 200. The n type semiconductor region 107 is provided on the p⁺ type collector region 108. The n⁺ type semiconductor region may be provided on the p⁺ type collector region 108 in place of the n type semiconductor region 107. The n⁻ type semiconductor region 102 is provided on the n type semiconductor region 107.

The conductor units 121 and the insulation portions 122 extend through, and are surrounded by, the n⁻ type semiconductor region 102, the n type semiconductor region 107, and the p⁺ type collector region 108.

The p type base regions 105 are selectively provided on the n⁻ type semiconductor region 102. The n⁺ type emitter regions 106 and the p⁺ type contact regions 109 are selectively provided on the p type base regions 105. The n⁺ type emitter regions 106 and the p⁺ type contact regions 109 are electrically connected to the emitter electrode 111.

In the example illustrated in FIG. 13, a plurality of n⁺ type emitter regions 106 are provided among the gate insulation layers 142 adjacent to one another in the X direction and the p⁺ type contact regions 109 are provided between these n⁺ type emitter regions 106. Alternatively, the n⁺ type emitter regions 106 and the p⁺ type contact regions 109 may be alternately provided, in the Y direction, between the gate insulation layers 142 adjacent to one another in the X direction.

The semiconductor element unit 200 and the semiconductor element unit 500 are connected, for example, inversely parallel to each other and the semiconductor element unit 200 may function as a freewheeling diode. That is, the current flows in the emitter electrode 111 from the first electrode 10 when the semiconductor element unit 500 is in an ON state. When the state of the semiconductor element unit 500 is switched from the ON state to the OFF state and a voltage is applied to the semiconductor device 3 by an inductance component, the current flows in the first electrode 10 from the anode electrode 211.

According to the present exemplary embodiment, the semiconductor device has a structure in which the semiconductor element units 200 and 500 having functions different from each other are stacked on each other. For this reason, the area required for mounting two semiconductor element units may be reduced compared to a case of separately mounting the two semiconductor element units.

In addition, a combination of the semiconductor element unit 500 described in the present exemplary embodiment and the semiconductor element unit 400 described in the second exemplary embodiment may be used.

Fourth Exemplary Embodiment

Figure 14:
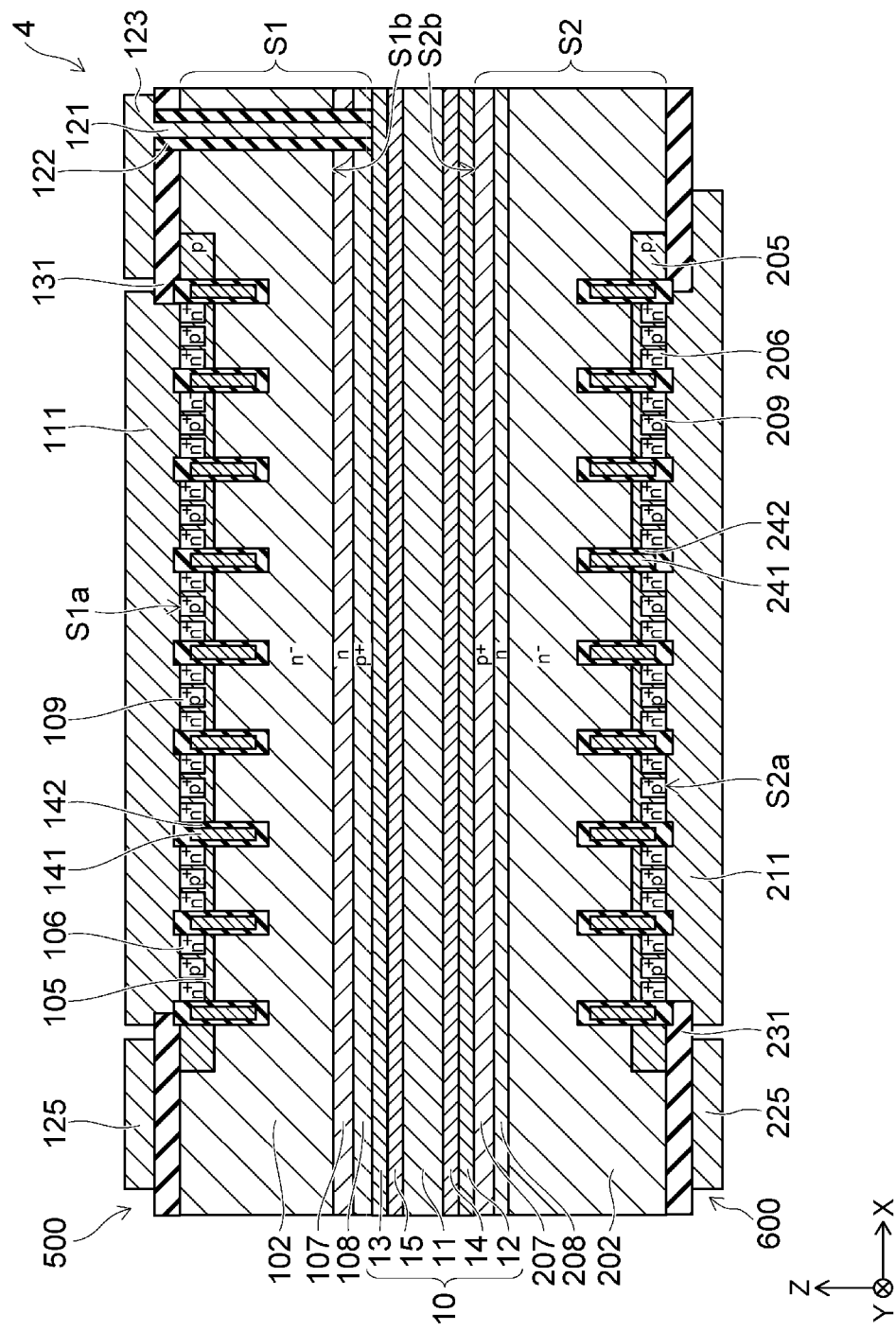
FIG. 14 is a sectional view illustrating a semiconductor device according to a fourth exemplary embodiment.

FIG. 14 is a sectional view of a semiconductor device 4 according to a fourth exemplary embodiment.

The structure of the semiconductor device 4 when seen from the Z direction is the same as the structure in the plan view illustrated in FIG. 10. The structure of the semiconductor device 4 when seen from the −Z direction is the same as the structure in the bottom view illustrated in FIG. 11.

The semiconductor device 4 includes a semiconductor element unit 500, a semiconductor element unit 600, and a first electrode 10.

The semiconductor element unit 600 is, for example, an IGBT. The semiconductor element unit 600 includes an n⁻ type semiconductor region 202, p type base regions 205, n⁺ type source regions 206, an emitter electrode 211, a gate electrode pad 225, an insulation layer 231, gate electrodes 241, and gate insulation layers 242.

The p⁺ type collector region 208 is provided below the first electrode 10 and over the n⁻ type semiconductor region 202. The p⁺ type collector region 208 is electrically connected to the first electrode 10. The first electrode 10 may function as a collector electrode of the semiconductor element units 500 and 600. The n type semiconductor region 207 is provided between the p⁺ type collector region 208 and the electrode 10. The n⁺ type semiconductor region may be provided in place of the n type semiconductor region 207. The n⁻ type semiconductor region 202 is provided on the p⁺ type collector region 208 on the side thereof opposite to the n type semiconductor region 207.

The p type base regions 205 are selectively provided extending inwardly of and on the surface of the n⁻ type semiconductor region 202 facing the insulation layer 231. The n⁺ type emitter regions 206 and the p⁺ type contact regions 209 are selectively provided to extend inwardly of the p type base region 205. The n⁺ type emitter regions 206 and the p⁺ type contact regions 209 are electrically connected to the emitter electrode 211.

Even in the present exemplary embodiment, similar to the first exemplary embodiment, miniaturization of the semiconductor device or a decrease in the density of the current flowing in the semiconductor device may be achieved.

Fifth Exemplary Embodiment

Figure 15:
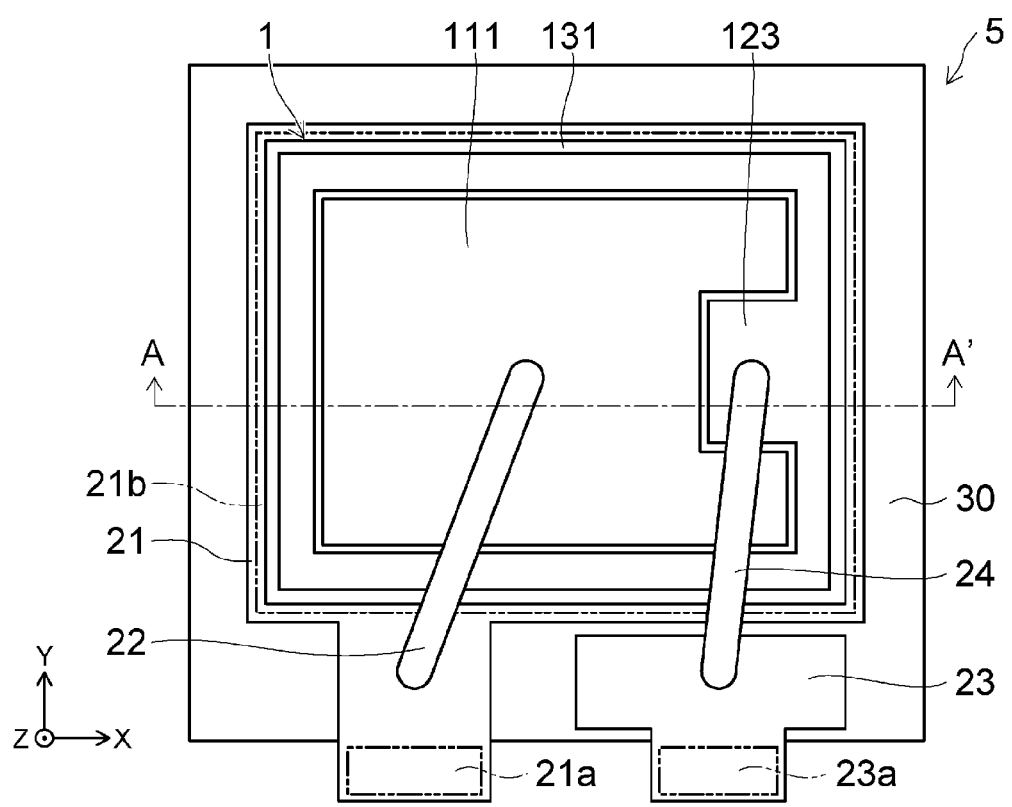
FIG. 15 is a plan view illustrating a semiconductor package according to a fifth exemplary embodiment.

FIG. 15 is a plan view of a semiconductor package 5 according to a fifth exemplary embodiment. The structure of the semiconductor package 5 is illustrated by rendering then insulation member 30 in FIG. 15 as transparent in the Figure.

Figure 16:
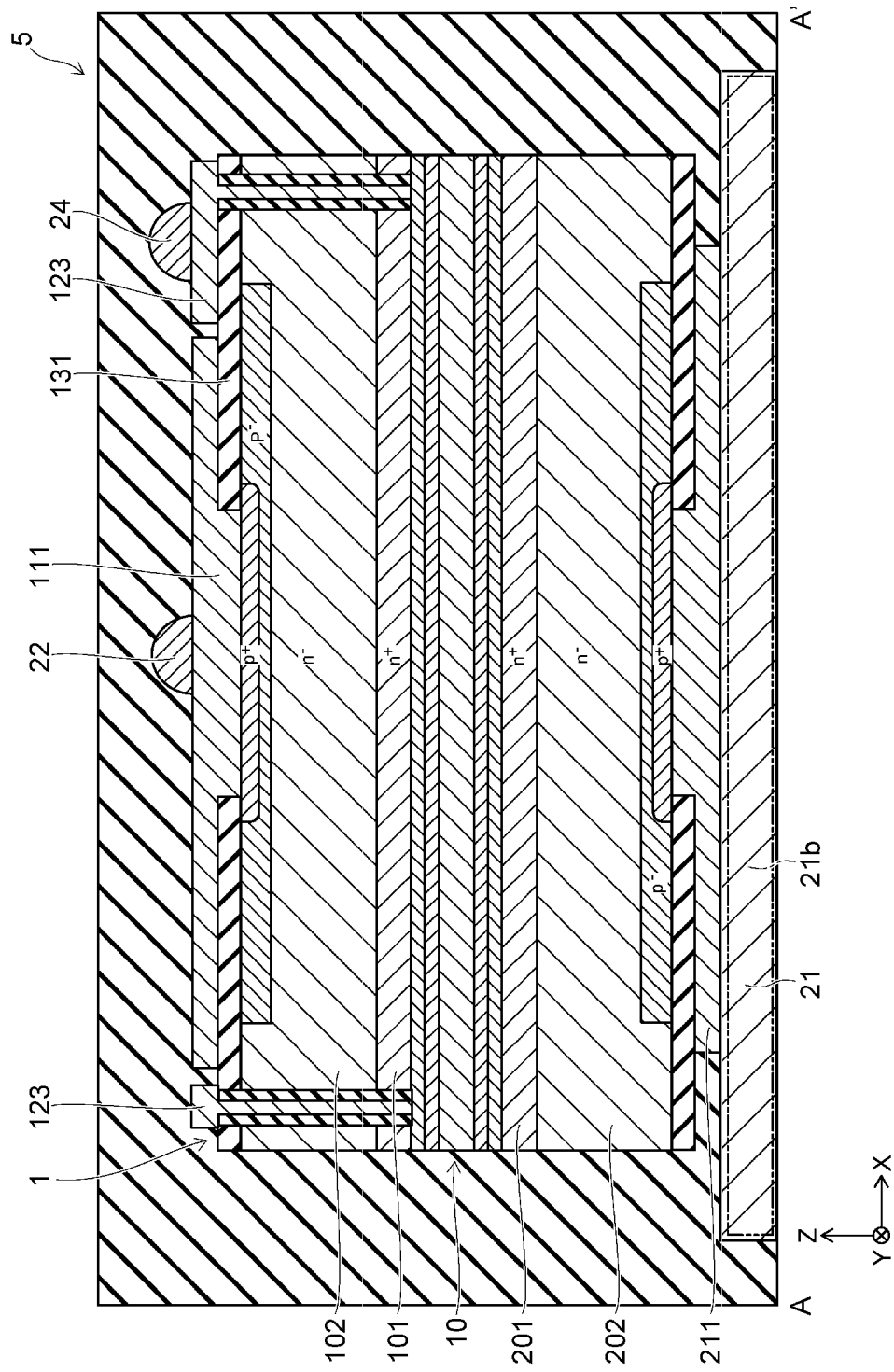
FIG. 16 is a sectional view taken along line A-A' of FIG. 15.

FIG. 16 is a sectional view taken along line A-A' of FIG. 15.

The semiconductor package 5 according to the present exemplary embodiment is obtained by packaging the semiconductor device 1.

The semiconductor package 5 includes the semiconductor device 1, a first conductive portion 21, a second conductive portion 23, and an encapsulating or sealing insulation member 30.

As illustrated in FIG. 15, the first conductive portion 21 and the second conductive portion 23 are spaced from each other with a gap therebetween. The first conductive portion 21 includes a first terminal 21a and a mounting portion 21b. The second conductive portion 23 includes a second terminal 23a. The semiconductor device 1 is located on the mounting portion 21b.

The first conductive portion 21 is electrically connected to the anode electrode 111 of the semiconductor device 1 by bonding wire 22. The second conductive portion 23 is electrically connected to the second electrode 123 by bonding wire 24. A plurality of the bonding wires 22 and 24 may be provided, for example, in order to reduce electrical resistance among respective conductive portions and respective electrodes.

For example, a copper alloy may be used as a material of the first conductive portion 21 and the second conductive portion 23. For example, aluminum may be used as a material of the bonding wires 22 and 24. For example, an insulating resin such as polyimide may be used as a material of the insulation member 30.

As illustrated in FIG. 16, the mounting portion 21b of the first conductive portion 21 is electrically connected to the anode electrode 211. That is, the anode electrodes 111 and 211 are respectively electrically connected to the first conductive portion 21.

The semiconductor device 1, a portion of the first conductive portion 21, the bonding wire 22, a portion of the second conductive portion 23, and the bonding wire 24 are covered by the insulation member 30. The first terminal 21a and the second terminal 23a are exposed without being covered with the insulation member 30 for connection to an external terminal. At least a portion of the mounting portion 21b on which the semiconductor device 1 is not mounted may be exposed for heat dissipation of the semiconductor package 5, for example.

According to the present exemplary embodiment, a semiconductor package may be made small by configuring the semiconductor package 5 using the semiconductor device 1.

Sixth Exemplary Embodiment

Figure 17:
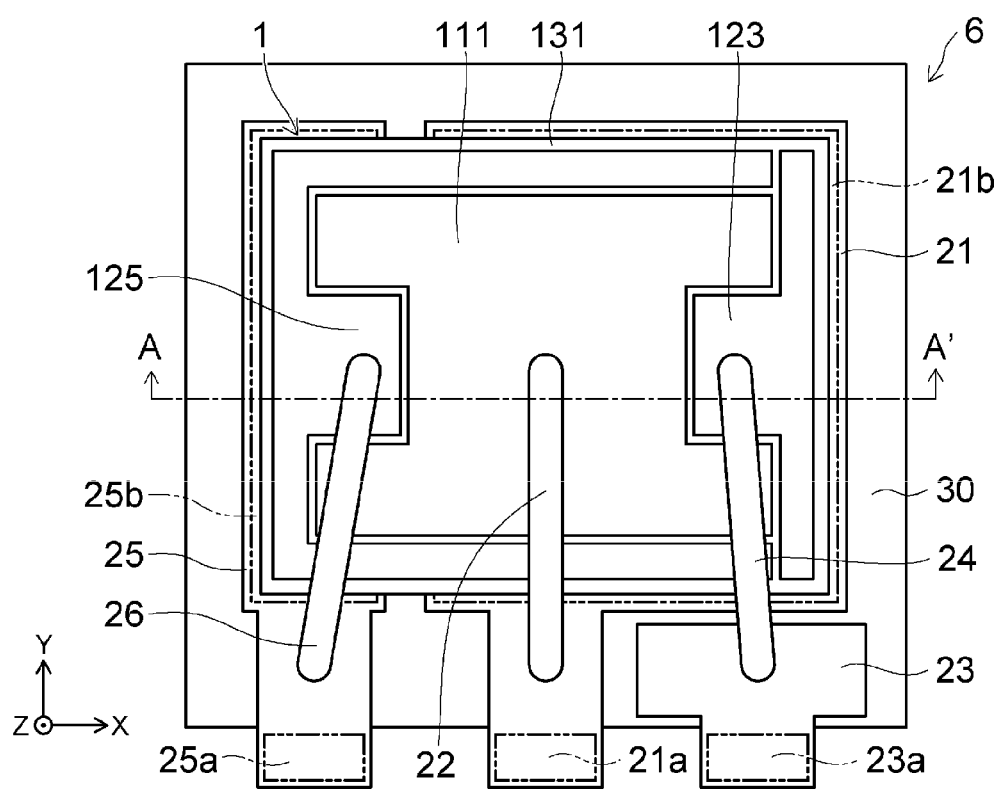
FIG. 17 is a plan view illustrating a semiconductor package according to a sixth exemplary embodiment.

FIG. 17 is a plan view of the semiconductor package 6 according to a sixth exemplary embodiment. The structure of the semiconductor package 6 is illustrated by rendering then insulation member 30 in FIG. 17 as transparent in the Figure.

Figure 18:
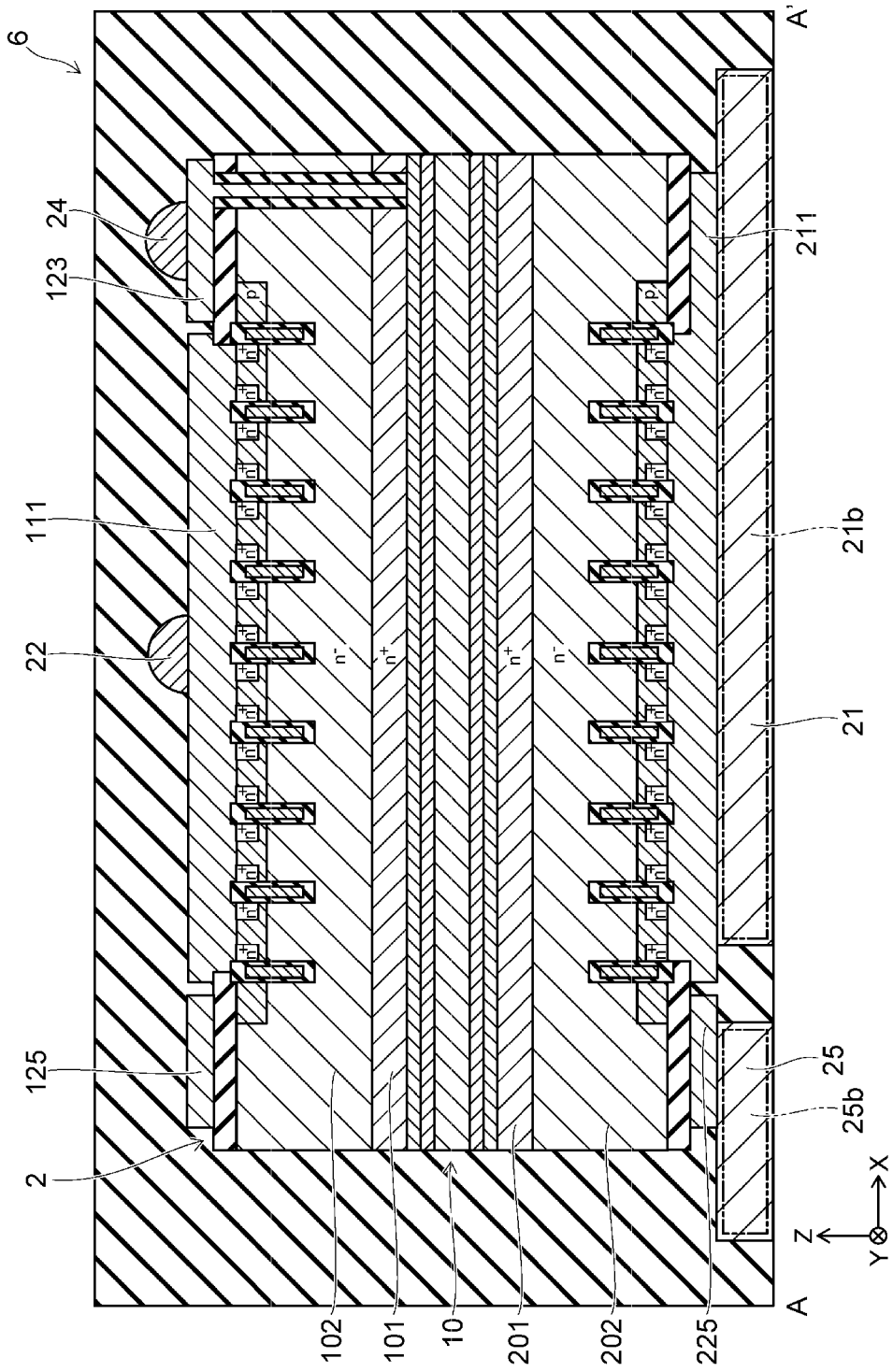
FIG. 18 is a sectional view taken along line A-A' of FIG. 17.

FIG. 18 is a sectional view taken along line A-A' of FIG. 17.

The semiconductor package 6 according to the present exemplary embodiment is obtained by packaging the semiconductor device 2.

The semiconductor package 6 includes the semiconductor device 2, a first conductive portion 21, a second conductive portion 23, a third conductive portion 25, and the insulation member 30.

As illustrated in FIG. 17, the first conductive portion 21, the second conductive portion 23, and the third conductive portion 25 are spaced from one another with gaps therebetween. The first conductive portion 21 includes a first terminal 21a and a mounting portion 21b. The second conductive portion 23 includes a second terminal 23a. The third conductive portion 25 includes a third terminal 25a and a mounting portion 25b. The semiconductor device 1 is located on the mounting portions 21b and 25b.

The first conductive portion 21 is electrically connected to the anode electrode 111 by bonding wire 22. The second conductive portion 23 is electrically connected to the second electrode 123 by bonding wire 24. The third conductive portion 25 is electrically connected to the gate electrode pad 125 by bonding wire 26. A plurality of the bonding wires 22, 24, and 26 may be used.

As illustrated in FIG. 18, the source electrode 211 of the semiconductor device 2 is electrically connected to the first conductive portion 21. The gate electrode pad 225 is electrically connected to the third conductive portion 25. The source electrodes 111 and 211 are both electrically connected to the first conductive portion 21. The gate electrode pads 125 and 225 are both electrically connected to the third conductive portion 25.

The semiconductor device 2, portions of respective leads, and respective bonding wires are covered with the insulation member 30. Portions of the first terminal 21a, second terminal 23a and the third terminal 25a extend from and are exposed without being covered with the insulation member 30 for connection thereof to external terminals.

Similar to the present exemplary embodiment, a semiconductor package may be made small by configuring the semiconductor package 6 using the semiconductor device 2.

Further, the semiconductor package 6 may be obtained by packaging the semiconductor device 3. In this case, the emitter electrode 111 and the anode electrode 211 of the semiconductor device 3 are electrically connected to the first conductive portion 21. In addition, the second electrode 123 is electrically connected to the second conductive portion 23 and the gate electrode pad 125 is electrically connected to the third conductive portion 25.

Seventh Exemplary Embodiment

Figure 19:
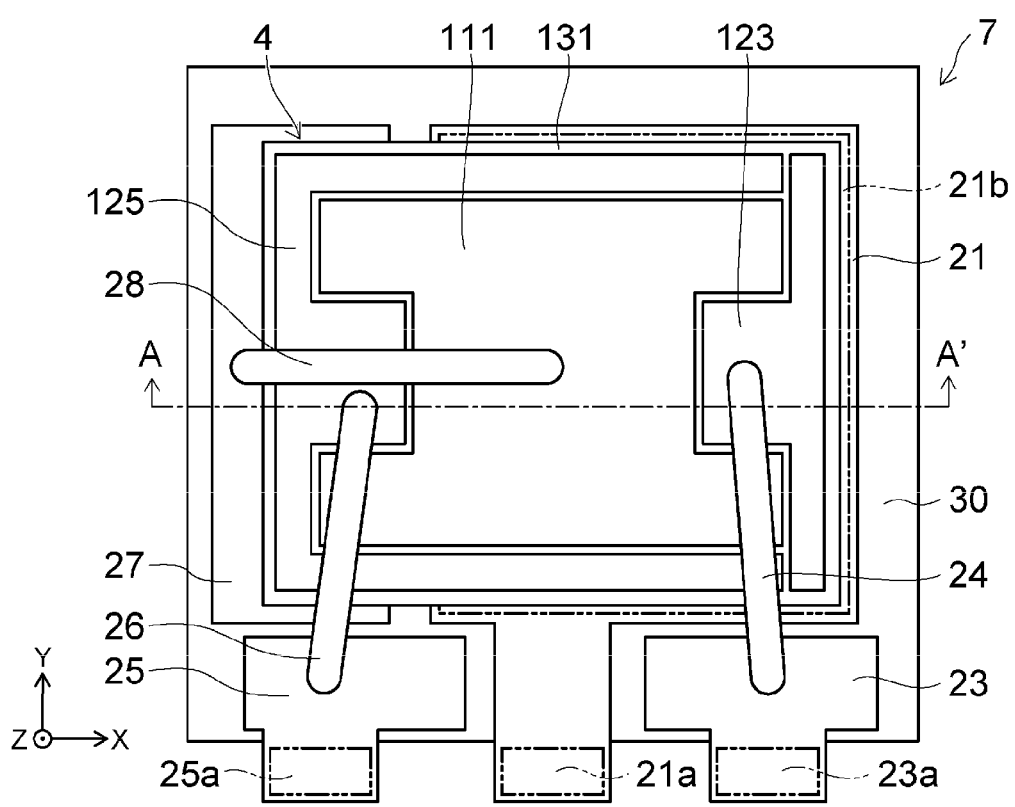
FIG. 19 is a plan view illustrating a semiconductor package according to a seventh exemplary embodiment.

FIG. 19 is a plan view of a semiconductor package 7 according to a seventh exemplary embodiment. The structure of the semiconductor package 7 is illustrated by transmitting an insulation member 30 in FIG. 19.

Figure 20:
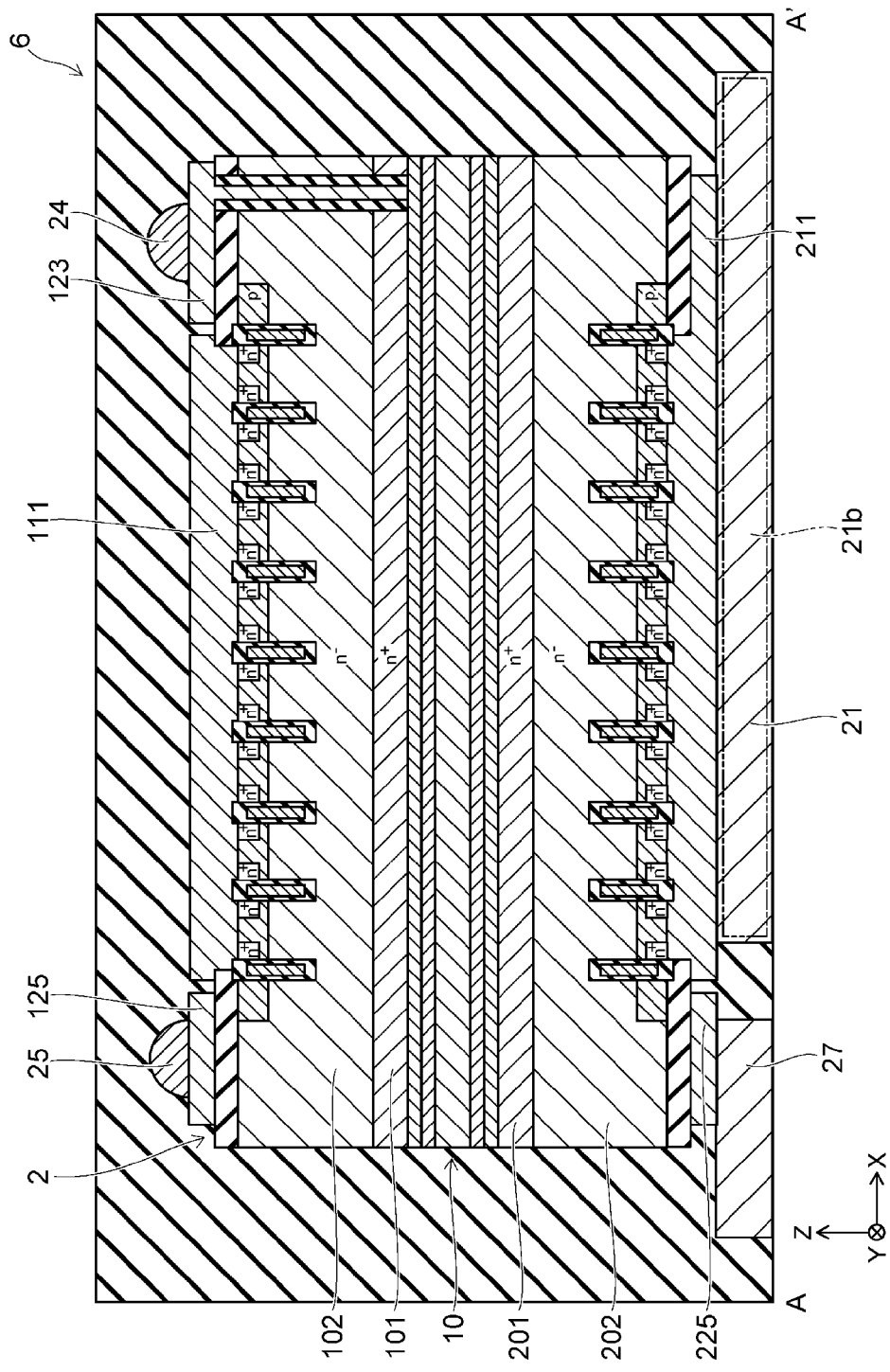
FIG. 20 is a sectional view taken along line A-A' of FIG. 19.

FIG. 20 is a sectional view taken along line A-A' of FIG. 19.

The semiconductor package 7 according to the present exemplary embodiment is obtained by packaging the semiconductor device 4.

The semiconductor package 7 includes the semiconductor device 4, a first conductive portion 21, a second conductive portion 23, a third conductive portion 25, an electrode 27, and the insulation member 30.

As illustrated in FIG. 19, the semiconductor package 7 includes the electrode 27 spaced from the first conductive portion 21, the second conductive portion 23, and the third conductive portion 25, with gaps between each component. The semiconductor device 4 is provided on the electrode 27 and the mounting portion 21b.

The electrode 27 is electrically connected to the emitter electrode 111 by the bonding wire 28. The second electrode 123 is electrically connected to the second conductive portion 23 by the bonding wire 24. The gate electrode pad 125 is electrically connected to the third conductive portion 25 by the bonding wire 26.

As illustrated in FIG. 20, the electrode 27 is electrically connected to the gate electrode pad 225, and thus the gate electrode 225 of the semiconductor element unit 600 is electrically connected to the emitter electrode 111 of the semiconductor element unit 500. The emitter electrode 211 is electrically connected to the first conductive portion 21. Accordingly, the semiconductor package 7 includes a Darlington transistor in which an output of the semiconductor element unit 500 is input to a gate of the semiconductor element unit 600.

According to the present exemplary embodiment, two semiconductor element units configuring the Darlington transistor are provided by being stacked on each other. Accordingly, the semiconductor package having a function as the Darlington transistor may be made small.

The relative level of the dopant concentration among respective semiconductor regions in the respective exemplary embodiments described above may be verified using, for example, a scanning capacitance microscope (SCM). Further, the carrier concentration in the respective semiconductor regions may be regarded to be equivalent to the activated dopant concentration in the respective semiconductor regions. Accordingly, the dopant concentration in the description of the above-described respective exemplary embodiments may be replaced by carrier concentration. The relative level of the carrier concentration among the respective semiconductor regions may be verified using the SCM.

Moreover, the dopant concentration of the respective semiconductor regions may be measured using, for example, secondary ion mass spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor package, comprising
   a semiconductor device including:
      a first semiconductor element, a second semiconductor element, and a common first electrode between the first and second semiconductor elements;
      a second electrode electrically connected to the first semiconductor element;
      a third electrode extending through the second semiconductor element and electrically connected to the first electrode; and
      a fourth electrode electrically connected to the second semiconductor element;

a first terminal electrically connected to the third electrode;

a second terminal electrically connected to the second electrode and the fourth electrode; and an insulating material surrounding the semiconductor device.

2. The semiconductor package of claim 1, wherein the first semiconductor element is a diode.

3. The semiconductor package of claim 2, wherein the second semiconductor element is an insulated gate bipolar transistor.

4. The semiconductor package of claim 1, wherein the second semiconductor element is a diode.

5. The semiconductor package of claim 1, wherein the first semiconductor element is an insulated gate bipolar transistor.

6. The semiconductor package of claim 5, wherein the second semiconductor element is also an insulated gate bipolar transistor.

7. A semiconductor package, comprising:
a semiconductor device including:
   a first semiconductor element, a second semiconductor element, and a common first electrode between the first and second semiconductor device elements;
   a second electrode electrically connected to the first semiconductor element;
   a third electrode extending through the second semiconductor element and electrically connected to the first electrode; and
   a fourth electrode electrically connected to the second semiconductor element;
a first terminal electrically connected to the second electrode;
a second terminal electrically connected to the fourth electrode;
a third terminal electrically connected to a fifth electrode; and
an insulation member that surrounds the semiconductor device.

8. The semiconductor package of claim 7, wherein the first semiconductor element is a diode.

9. The semiconductor package of claim 8, wherein the second semiconductor element is an insulated gate bipolar transistor.

10. The semiconductor package of claim 7, wherein the second semiconductor element is a diode.

11. The semiconductor package of claim 7, wherein the first semiconductor element is an insulated gate bipolar transistor.

12. The semiconductor package of claim 11, wherein the second semiconductor element is also an insulated gate bipolar transistor.

* * * * *